US011449232B1

United States Patent
Kannan et al.

(10) Patent No.: US 11,449,232 B1
(45) Date of Patent: Sep. 20, 2022

(54) OPTIMAL SCHEDULING OF FLASH OPERATIONS

(71) Applicant: Pure Storage, Inc., Mountain View, CA (US)

(72) Inventors: Hari Kannan, Mountain View, CA (US); Nenad Miladinovic, Mountain View, CA (US); Randy Zhao, Mountain View, CA (US)

(73) Assignee: Pure Storage, Inc., Mountain View, CA (US)

( * ) Notice: Subject to any disclaimer, the term of this patent is extended or adjusted under 35 U.S.C. 154(b) by 215 days.

(21) Appl. No.: 15/336,618

(22) Filed: Oct. 27, 2016

Related U.S. Application Data

(60) Provisional application No. 62/365,864, filed on Jul. 22, 2016.

(51) Int. Cl.
  *G06F 3/06*  (2006.01)
  *G11C 16/34*  (2006.01)
  (Continued)

(52) U.S. Cl.
  CPC .......... *G06F 3/0611* (2013.01); *G06F 3/0659* (2013.01); *G06F 3/0679* (2013.01);
  (Continued)

(58) Field of Classification Search
  None
  See application file for complete search history.

(56) References Cited

U.S. PATENT DOCUMENTS

| 5,390,327 A | 2/1995 | Lubbers et al. |
| 5,479,653 A | 12/1995 | Jones |

(Continued)

FOREIGN PATENT DOCUMENTS

| EP | 2164006 | 3/2010 |
| EP | 2256621 | 12/2010 |

(Continued)

OTHER PUBLICATIONS

J. Hsieh, C. Chen and H. Lin, "Adaptive ECC Scheme for Hybrid SSD's," in IEEE Transactions on Computers, vol. 64, No. 12, pp. 3348-3361, Dec. 1, 2015, doi: 10.1109/TC.2015.2401028. (Year: 2015).*

(Continued)

*Primary Examiner* — Jared I Rutz
*Assistant Examiner* — Marwan Ayash
(74) *Attorney, Agent, or Firm* — Womble Bond Dickinson (US) LLP

(57) ABSTRACT

A scheduling system for a memory controller is provided. The system includes a scheduler configurable to receive a plurality of operation requests from a plurality of masters. The scheduler is configurable to form a sequence of one or more phases from each of the operation requests. The scheduler is configurable to arbitrate the plurality of operation requests and the one or more phases through one or more configurable policies. The system includes a sequencer configurable to receive the one or more phases and communicate with at least two flash memory devices having differing types of flash memory device interfaces through a plurality of channels.

20 Claims, 18 Drawing Sheets

(51) Int. Cl.
  *G11C 16/10* (2006.01)
  *G11C 16/26* (2006.01)
  *G11C 16/14* (2006.01)

(52) U.S. Cl.
  CPC .............. *G11C 16/10* (2013.01); *G11C 16/14* (2013.01); *G11C 16/26* (2013.01); *G11C 16/3495* (2013.01)

(56) References Cited

U.S. PATENT DOCUMENTS

| | | | |
|---|---|---|---|
| 5,649,093 A | 7/1997 | Hanko et al. |
| 6,275,898 B1 | 8/2001 | DeKoning |
| 6,535,417 B2 | 3/2003 | Tsuda |
| 6,643,748 B1 | 11/2003 | Wieland |
| 6,725,392 B1 | 4/2004 | Frey et al. |
| 6,836,816 B2 | 12/2004 | Kendall |
| 6,985,995 B2 | 1/2006 | Holland et al. |
| 7,032,125 B2 | 4/2006 | Holt et al. |
| 7,051,155 B2 | 5/2006 | Talagala et al. |
| 7,065,617 B2 | 6/2006 | Wang |
| 7,069,383 B2 | 6/2006 | Yamamoto et al. |
| 7,076,606 B2 | 7/2006 | Orsley |
| 7,107,480 B1 | 9/2006 | Moshayedi et al. |
| 7,159,150 B2 | 1/2007 | Kenchammana-Hosekote et al. |
| 7,162,575 B2 | 1/2007 | Dalal et al. |
| 7,164,608 B2 | 1/2007 | Lee |
| 7,334,156 B2 | 2/2008 | Land et al. |
| 7,370,220 B1 | 5/2008 | Nguyen et al. |
| 7,424,498 B1 | 9/2008 | Patterson |
| 7,424,592 B1 | 9/2008 | Karr |
| 7,444,532 B2 | 10/2008 | Masuyama et al. |
| 7,480,658 B2 | 1/2009 | Heinla et al. |
| 7,536,506 B2 | 5/2009 | Ashmore et al. |
| 7,558,859 B2 | 7/2009 | Kasiolas |
| 7,613,947 B1 | 11/2009 | Coatney |
| 7,681,104 B1 | 3/2010 | Sim-Tang et al. |
| 7,681,105 B1 | 3/2010 | Sim-Tang et al. |
| 7,730,258 B1 | 6/2010 | Smith |
| 7,743,276 B2 | 6/2010 | Jacobsen et al. |
| 7,757,038 B2 | 7/2010 | Kitahara |
| 7,778,960 B1 | 8/2010 | Chatterjee et al. |
| 7,814,272 B2 | 10/2010 | Barrall et al. |
| 7,814,273 B2 | 10/2010 | Barrall |
| 7,818,531 B2 | 10/2010 | Barrall |
| 7,827,351 B2 | 11/2010 | Suetsugu et al. |
| 7,827,439 B2 | 11/2010 | Matthew et al. |
| 7,870,105 B2 | 1/2011 | Arakawa et al. |
| 7,885,938 B1 | 2/2011 | Greene et al. |
| 7,886,111 B2 | 2/2011 | Klemm et al. |
| 7,908,448 B1 | 3/2011 | Chatterjee et al. |
| 7,916,538 B2 | 3/2011 | Jeon et al. |
| 7,941,697 B2 | 5/2011 | Mathew et al. |
| 7,958,303 B2 | 6/2011 | Shuster |
| 7,971,129 B2 | 6/2011 | Watson |
| 7,991,822 B2 | 8/2011 | Bish et al. |
| 8,010,485 B1 | 8/2011 | Chatterjee et al. |
| 8,010,829 B1 | 8/2011 | Chatterjee et al. |
| 8,020,047 B2 | 9/2011 | Courtney |
| 8,046,548 B1 | 10/2011 | Chatterjee et al. |
| 8,051,361 B2 | 11/2011 | Sim-Tang et al. |
| 8,051,362 B2 | 11/2011 | Li et al. |
| 8,082,393 B2 | 12/2011 | Galloway et al. |
| 8,086,634 B2 | 12/2011 | Mimatsu |
| 8,086,911 B1 | 12/2011 | Taylor |
| 8,090,837 B2 | 1/2012 | Shin et al. |
| 8,108,502 B2 | 1/2012 | Tabbara et al. |
| 8,117,388 B2 | 2/2012 | Jernigan, IV |
| 8,140,821 B1 | 3/2012 | Raizen et al. |
| 8,145,838 B1 | 3/2012 | Miller et al. |
| 8,145,840 B2 | 3/2012 | Koul et al. |
| 8,176,360 B2 | 5/2012 | Frost et al. |
| 8,180,855 B2 | 5/2012 | Aiello et al. |
| 8,200,922 B2 | 6/2012 | McKean et al. |
| 8,225,006 B1 | 7/2012 | Karamcheti |
| 8,239,618 B2 | 8/2012 | Kotzur et al. |
| 8,244,999 B1 | 8/2012 | Chatterjee et al. |
| 8,305,811 B2 | 11/2012 | Jeon |
| 8,315,999 B2 | 11/2012 | Chatley et al. |
| 8,327,080 B1 | 12/2012 | Der |
| 8,351,290 B1 | 1/2013 | Huang et al. |
| 8,375,146 B2 | 2/2013 | Sinclair |
| 8,402,152 B2 | 3/2013 | Duran |
| 8,412,880 B2 | 4/2013 | Leibowitz et al. |
| 8,423,739 B2 | 4/2013 | Ash et al. |
| 8,429,436 B2 | 4/2013 | Filingim et al. |
| 8,473,778 B2 | 6/2013 | Simitci |
| 8,479,037 B1 | 7/2013 | Chatterjee et al. |
| 8,498,967 B1 | 7/2013 | Chatterjee et al. |
| 8,522,073 B2 | 8/2013 | Cohen |
| 8,533,527 B2 | 9/2013 | Daikokuya et al. |
| 8,544,029 B2 | 9/2013 | Bakke et al. |
| 8,589,625 B2 | 11/2013 | Colgrove et al. |
| 8,595,455 B2 | 11/2013 | Chatterjee et al. |
| 8,615,599 B1 | 12/2013 | Takefman et al. |
| 8,627,136 B2 | 1/2014 | Shankar et al. |
| 8,627,138 B1 | 1/2014 | Clark |
| 8,660,131 B2 | 2/2014 | Vermunt et al. |
| 8,661,218 B1 | 2/2014 | Piszczek et al. |
| 8,700,875 B1 | 4/2014 | Barron et al. |
| 8,706,694 B2 | 4/2014 | Chatterjee et al. |
| 8,706,914 B2 | 4/2014 | Duchesneau |
| 8,713,405 B2 | 4/2014 | Healey et al. |
| 8,725,730 B2 | 5/2014 | Keeton et al. |
| 8,756,387 B2 | 6/2014 | Frost et al. |
| 8,762,793 B2 | 6/2014 | Grube et al. |
| 8,775,858 B2 | 7/2014 | Gower et al. |
| 8,775,868 B2 | 7/2014 | Colgrove et al. |
| 8,788,913 B1 | 7/2014 | Xin et al. |
| 8,799,746 B2 | 8/2014 | Baker et al. |
| 8,819,311 B2 | 8/2014 | Liao |
| 8,819,383 B1 | 8/2014 | Jobanputra et al. |
| 8,824,261 B1 | 9/2014 | Miller et al. |
| 8,843,700 B1 | 9/2014 | Salessi et al. |
| 8,850,108 B1 | 9/2014 | Hayes et al. |
| 8,850,288 B1 | 9/2014 | Lazier et al. |
| 8,856,593 B2 | 10/2014 | Eckhardt et al. |
| 8,856,619 B1 | 10/2014 | Cypher |
| 8,862,847 B2 | 10/2014 | Feng et al. |
| 8,862,928 B2 | 10/2014 | Xavier et al. |
| 8,868,825 B1 | 10/2014 | Hayes |
| 8,874,836 B1 * | 10/2014 | Hayes .................. G06F 3/0659 711/103 |
| 8,886,778 B2 | 11/2014 | Nedved et al. |
| 8,898,383 B2 | 11/2014 | Yamamoto et al. |
| 8,898,388 B1 | 11/2014 | Kimmel |
| 8,904,231 B2 | 12/2014 | Coatney et al. |
| 8,918,478 B2 | 12/2014 | Ozzie et al. |
| 8,930,307 B2 | 1/2015 | Colgrove et al. |
| 8,930,633 B2 | 1/2015 | Amit et al. |
| 8,949,502 B2 | 2/2015 | McKnight et al. |
| 8,959,110 B2 | 2/2015 | Smith et al. |
| 8,977,597 B2 | 3/2015 | Ganesh et al. |
| 9,003,144 B1 | 4/2015 | Hayes et al. |
| 9,009,724 B2 | 4/2015 | Gold et al. |
| 9,021,053 B2 | 4/2015 | Bembo et al. |
| 9,021,215 B2 | 4/2015 | Meir et al. |
| 9,025,393 B2 | 5/2015 | Wu |
| 9,043,372 B2 | 5/2015 | Makkar et al. |
| 9,053,808 B2 | 6/2015 | Sprouse |
| 9,058,155 B2 | 6/2015 | Cepulis et al. |
| 9,116,819 B2 | 8/2015 | Cope et al. |
| 9,117,536 B2 | 8/2015 | Yoon |
| 9,122,401 B2 | 9/2015 | Zaltsman et al. |
| 9,134,908 B2 | 9/2015 | Horn et al. |
| 9,153,337 B2 | 10/2015 | Sutardja |
| 9,189,650 B2 | 11/2015 | Jaye et al. |
| 9,201,733 B2 | 12/2015 | Verma |
| 9,207,876 B2 | 12/2015 | Shu et al. |
| 9,251,066 B2 | 2/2016 | Colgrove et al. |
| 9,323,667 B2 | 4/2016 | Bennett |
| 9,323,681 B2 | 4/2016 | Apostolides et al. |
| 9,348,538 B2 | 5/2016 | Mallaiah et al. |
| 9,384,082 B1 | 7/2016 | Lee et al. |

(56) References Cited

U.S. PATENT DOCUMENTS

| | | | |
|---|---|---|---|
| 9,405,478 B2 | 8/2016 | Koseki et al. | |
| 9,432,541 B2 | 8/2016 | Ishida | |
| 9,477,632 B2 | 10/2016 | Du | |
| 9,818,478 B2 | 11/2017 | Chung | |
| 9,829,066 B2 | 11/2017 | Thomas et al. | |
| 2002/0144059 A1 | 10/2002 | Kendall | |
| 2003/0105984 A1 | 6/2003 | Masuyama et al. | |
| 2003/0110205 A1 | 6/2003 | Johnson | |
| 2004/0161086 A1 | 8/2004 | Buntin et al. | |
| 2005/0001652 A1 | 1/2005 | Malik et al. | |
| 2005/0076228 A1 | 4/2005 | Davis et al. | |
| 2005/0235132 A1 | 10/2005 | Karr et al. | |
| 2005/0278460 A1 | 12/2005 | Shin et al. | |
| 2005/0283649 A1 | 12/2005 | Turner et al. | |
| 2006/0015683 A1 | 1/2006 | Ashmore et al. | |
| 2006/0106950 A1* | 5/2006 | Wang | G06F 3/0613 710/5 |
| 2006/0114930 A1 | 6/2006 | Lucas et al. | |
| 2006/0174157 A1 | 8/2006 | Barrall et al. | |
| 2006/0248294 A1 | 11/2006 | Nedved et al. | |
| 2007/0079068 A1 | 4/2007 | Draggon | |
| 2007/0214194 A1 | 9/2007 | Reuter | |
| 2007/0214314 A1 | 9/2007 | Reuter | |
| 2007/0234016 A1 | 10/2007 | Davis et al. | |
| 2007/0268905 A1 | 11/2007 | Baker et al. | |
| 2008/0080709 A1 | 4/2008 | Michtchenko et al. | |
| 2008/0107274 A1 | 5/2008 | Worthy | |
| 2008/0155191 A1 | 6/2008 | Anderson et al. | |
| 2008/0295118 A1 | 11/2008 | Liao | |
| 2009/0077208 A1 | 3/2009 | Nguyen et al. | |
| 2009/0138654 A1 | 5/2009 | Sutardja | |
| 2009/0216910 A1 | 8/2009 | Duchesneau | |
| 2009/0216920 A1 | 8/2009 | Lauterbach et al. | |
| 2010/0017444 A1 | 1/2010 | Chatterjee et al. | |
| 2010/0023800 A1* | 1/2010 | Harari | G06F 12/0246 714/2 |
| 2010/0042636 A1 | 2/2010 | Lu | |
| 2010/0094806 A1 | 4/2010 | Apostolides et al. | |
| 2010/0115070 A1 | 5/2010 | Missimilly | |
| 2010/0125695 A1 | 5/2010 | Wu et al. | |
| 2010/0162076 A1 | 6/2010 | Sim-Tang et al. | |
| 2010/0169707 A1 | 7/2010 | Mathew et al. | |
| 2010/0174576 A1 | 7/2010 | Naylor | |
| 2010/0268908 A1 | 10/2010 | Ouyang et al. | |
| 2011/0040924 A1* | 2/2011 | Selinger | G06F 11/10 711/103 |
| 2011/0040925 A1 | 2/2011 | Frost et al. | |
| 2011/0041005 A1* | 2/2011 | Selinger | G06F 11/10 714/719 |
| 2011/0041039 A1* | 2/2011 | Harari | G11C 29/76 714/773 |
| 2011/0060927 A1 | 3/2011 | Fillingim et al. | |
| 2011/0119462 A1 | 5/2011 | Leach et al. | |
| 2011/0161554 A1* | 6/2011 | Selinger | G06F 13/1668 711/103 |
| 2011/0161784 A1* | 6/2011 | Selinger | G06F 11/1068 714/768 |
| 2011/0219170 A1 | 9/2011 | Frost et al. | |
| 2011/0238625 A1 | 9/2011 | Hamaguchi et al. | |
| 2011/0264843 A1 | 10/2011 | Haines et al. | |
| 2011/0302369 A1 | 12/2011 | Goto et al. | |
| 2012/0011398 A1 | 1/2012 | Eckhardt | |
| 2012/0079318 A1 | 3/2012 | Colgrove et al. | |
| 2012/0110249 A1 | 5/2012 | Jeong et al. | |
| 2012/0131253 A1 | 5/2012 | McKnight | |
| 2012/0158923 A1 | 6/2012 | Mohamed et al. | |
| 2012/0173792 A1* | 7/2012 | Lassa | G06F 9/4843 711/103 |
| 2012/0191900 A1 | 7/2012 | Kunimatsu et al. | |
| 2012/0198152 A1 | 8/2012 | Terry et al. | |
| 2012/0198261 A1 | 8/2012 | Brown et al. | |
| 2012/0209943 A1 | 8/2012 | Jung | |
| 2012/0226934 A1 | 9/2012 | Rao | |
| 2012/0246435 A1 | 9/2012 | Meir et al. | |
| 2012/0260055 A1 | 10/2012 | Murase | |
| 2012/0311557 A1 | 12/2012 | Resch | |
| 2013/0022201 A1 | 1/2013 | Glew et al. | |
| 2013/0036314 A1 | 2/2013 | Glew et al. | |
| 2013/0042056 A1 | 2/2013 | Shats | |
| 2013/0060884 A1 | 3/2013 | Bernbo et al. | |
| 2013/0067188 A1 | 3/2013 | Mehra et al. | |
| 2013/0073894 A1 | 3/2013 | Xavier et al. | |
| 2013/0124776 A1 | 5/2013 | Hallak et al. | |
| 2013/0132800 A1 | 5/2013 | Healy et al. | |
| 2013/0151653 A1 | 6/2013 | Sawiki | |
| 2013/0151771 A1 | 6/2013 | Tsukahara et al. | |
| 2013/0173853 A1 | 7/2013 | Ungureanu et al. | |
| 2013/0238554 A1 | 9/2013 | Yucel et al. | |
| 2013/0339314 A1 | 12/2013 | Carpenter et al. | |
| 2013/0339635 A1 | 12/2013 | Amit et al. | |
| 2013/0339818 A1 | 12/2013 | Baker et al. | |
| 2014/0040535 A1 | 2/2014 | Lee | |
| 2014/0040702 A1 | 2/2014 | He et al. | |
| 2014/0047263 A1 | 2/2014 | Coatney et al. | |
| 2014/0047269 A1 | 2/2014 | Kim | |
| 2014/0063721 A1 | 3/2014 | Herman et al. | |
| 2014/0064048 A1 | 3/2014 | Cohen et al. | |
| 2014/0068224 A1 | 3/2014 | Fan et al. | |
| 2014/0075252 A1 | 3/2014 | Luo et al. | |
| 2014/0136880 A1 | 5/2014 | Shankar et al. | |
| 2014/0181402 A1 | 6/2014 | White | |
| 2014/0237164 A1 | 8/2014 | Le et al. | |
| 2014/0245098 A1* | 8/2014 | Sharon | H03M 13/2942 714/755 |
| 2014/0279936 A1 | 9/2014 | Bernbo et al. | |
| 2014/0280025 A1 | 9/2014 | Eidson et al. | |
| 2014/0289588 A1 | 9/2014 | Nagadomi et al. | |
| 2014/0380125 A1 | 12/2014 | Calder et al. | |
| 2014/0380126 A1 | 12/2014 | Yekhanin et al. | |
| 2015/0032720 A1 | 1/2015 | James | |
| 2015/0039645 A1 | 2/2015 | Lewis | |
| 2015/0039849 A1 | 2/2015 | Lewis | |
| 2015/0089283 A1 | 3/2015 | Kermarrec et al. | |
| 2015/0100746 A1 | 4/2015 | Rychlik | |
| 2015/0134824 A1 | 5/2015 | Mickens | |
| 2015/0153800 A1 | 6/2015 | Lucas et al. | |
| 2015/0180714 A1 | 6/2015 | Chunn | |
| 2015/0280959 A1 | 10/2015 | Vincent | |
| 2015/0316969 A1* | 11/2015 | Grunzke | G11C 5/147 713/310 |
| 2016/0179388 A1* | 6/2016 | Huang | G06F 13/1668 711/103 |
| 2017/0123682 A1* | 5/2017 | Sinclair | G06F 3/0611 |

FOREIGN PATENT DOCUMENTS

| | | |
|---|---|---|
| WO | WO 02-13033 | 2/2002 |
| WO | WO 2008103569 | 8/2008 |
| WO | WO 2008157081 | 12/2008 |
| WO | WO 2013032825 | 7/2013 |

OTHER PUBLICATIONS

Yuan-Hao Chang and Tei-Wei Kuo. 2010. A reliable MTD design for MLC flash-memory storage systems. In <i>Proceedings of the tenth ACM international conference on Embedded software</i> (<i>EMSOFT '10</i>). Association for Computing Machinery, New York, NY, USA, 179-188. (Year: 2010).*

L.-P. Chang, "A hybrid approach to NAND-flash-based solidstate disks," IEEE Trans. Comput., vol. 59, No. 10, pp. 1337-1349, Oct. 2010. (Year: 2010).*

Hwang, Kai, et al. "RAID-x: A New Distributed Disk Array for I/O-Centric Cluster Computing," HPDC '00 Proceedings of the 9th IEEE International Symposium on High Performance Distributed Computing, IEEE, 2000, pp. 279-286.

Schmid, Patrick: "RAID Scaling Charts, Part 3:4-128 kB Stripes Compared", Tom's Hardware, Nov. 27, 2007 (http://www.tomshardware.com/reviews/RAID-SCALING-CHARTS.1735-4.html), See pp. 1-2.

Storer, Mark W. et al., "Pergamum: Replacing Tape with Energy Efficient, Reliable, Disk-Based Archival Storage," Fast '08: 6th

(56) References Cited

OTHER PUBLICATIONS

USENIX Conference on File and Storage Technologies, San Jose, CA, Feb. 26-29, 2008 pp. 1-16.
Ju-Kyeong Kim et al., "Data Access Frequency based Data Replication Method using Erasure Codes in Cloud Storage System", Journal of the Institute of Electronics and Information Engineers, Feb. 2014, vol. 51, No. 2, pp. 85-91.
International Search Report and the Written Opinion of the International Searching Authority, PCT/US2015/018169, dated May 15, 2015.
International Search Report and the Written Opinion of the International Searching Authority, PCT/US2015/034302, dated Sep. 11, 2015.
International Search Report and the Written Opinion of the International Searching Authority, PCT/US2015/039135, dated Sep. 18, 2015.
International Search Report and the Written Opinion of the International Searching Authority, PCT/US2015/039136, dated Sep. 23, 2015.
International Search Report, PCT/US2015/039142, dated Sep. 24, 2015.
International Search Report, PCT/US2015/034291, dated Sep. 30, 2015.
International Search Report and the Written Opinion of the International Searching Authority, PCT/US2015/039137, dated Oct. 1, 2015.
International Search Report, PCT/US2015/044370, dated Dec. 15, 2015.
International Search Report amd the Written Opinion of the International Searching Authority, PCT/US2016/031039, dated May 5, 2016.
International Search Report, PCT/US2016/014604, dated May 19, 2016.
International Search Report, PCT/US2016/014361, dated May 30, 2016.
International Search Report, PCT/US2016/014356, dated Jun. 28, 2016.
International Search Report, PCT/US2016/014357, dated Jun. 29, 2016.
International Seach Report and the Written Opinion of the International Searching Authority, PCT/US2016/016504, dated Jul. 6, 2016.
International Seach Report and the Written Opinion of the International Searching Authority, PCT/US2016/024391, dated Jul. 12, 2016.
International Seach Report and the Written Opinion of the International Searching Authority, PCT/US2016/026529, dated Jul. 19, 2016.
International Seach Report and the Written Opinion of the International Searching Authority, PCT/US2016/023485, dated Jul. 21, 2016.
International Seach Report and the Written Opinion of the International Searching Authority, PCT/US2016/033306, dated Aug. 19, 2016.
International Seach Report and the Written Opinion of the International Searching Authority, PCT/US2016/047808, dated Nov. 25, 2016.

\* cited by examiner

OPTIMAL SCHEDULING OF FLASH OPERATIONS

BACKGROUND

NAND flash memory is available from different vendors, with different flash memory device interfaces and protocols. These protocols include asynchronous SDR (single data rate), synchronous DDR (double data rate), Toggle Mode (also a type of DDR or double data rate, in various release versions and from various manufacturers) and ONFI (Open NAND Flash Interface Working Group Standard, also a type of DDR or double data rate, in various release versions and from various manufacturers), and others may be developed. The proliferation of flash memory device interfaces and protocols poses a problem to designers of flash controllers for various storage devices, who generally choose one flash memory device interface and one protocol, and design the flash controller according to the selected device. However, even if a device had the ability to support different channels in a single flash controller, it would be desirable for the device to support scheduling parallel operations across the different channels/flash devices. It is within this context that the embodiments arise.

SUMMARY

In some embodiments, a scheduling system for a memory controller is provided. The system includes a scheduler configurable to receive a plurality of operation requests from a plurality of masters. The scheduler is configurable to form a sequence of one or more phases from each of the operation requests. The scheduler is configurable to arbitrate the plurality of operation requests and the one or more phases through one or more configurable policies and track the lifetime of operation requests through a scoreboarding mechanism. The system includes a sequencer configurable to receive the one or more phases and communicate with at least two flash memory devices having differing types of flash memory device interfaces through a plurality of channels, wherein the received phases are flash memory device independent commends.

Other aspects and advantages of the embodiments will become apparent from the following detailed description taken in conjunction with the accompanying drawings which illustrate, by way of example, the principles of the described embodiments.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Figure 1:
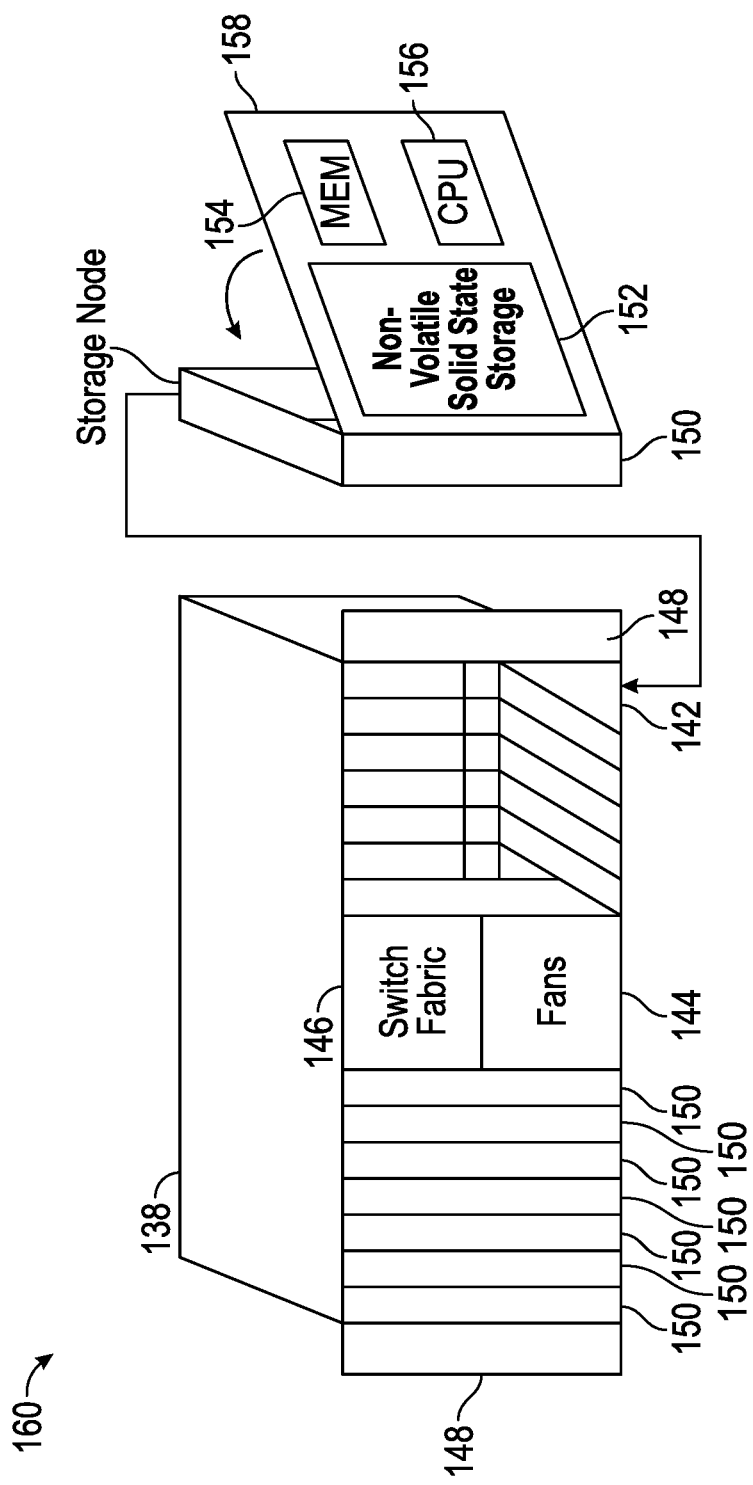
FIG. 1 is a perspective view of a storage cluster with multiple storage nodes and internal storage coupled to each storage node to provide network attached storage, in accordance with some embodiments.

Various storage systems described herein, and further storage systems, can be optimized for distribution of selected data, according to various criteria, in flash or other solid-state memory. The embodiments for the distributed flash wear leveling system are optimized for faster read access to the flash or other solid-state memory. Flash memory that is worn, i.e., that has a large number of program/erase cycles, often or usually has a greater error rate during read accesses, and this adds to read latency for data bits as a result of the processing time overhead to perform error correction. Various embodiments of the storage system track program/erase cycles, or track read errors or error rates, for example on a page, block, die, package, board, storage unit or storage node basis, are aware of faster and slower types or designs of flash memory or portions of flash memory, or otherwise determine relative access speeds for flash memory. The storage system then places data selectively in faster access or slower access locations in or portions of flash memory (or other solid-state memory). One embodiments of the storage system writes data bits to faster access portions of flash memory and parity bits to slower access portions of flash memory. Another embodiment takes advantage of faster and slower access pages of triple level cell flash memory. Principles of operation, variations, and implementation details for distributed flash wear leveling are further discussed below, with reference to FIGS. 6-13, following description of embodiments of a storage cluster with storage nodes, suitable for distributed flash wear leveling, with reference to FIGS. 1-5.

The embodiments below describe a storage cluster that stores user data, such as user data originating from one or more user or client systems or other sources external to the storage cluster. The storage cluster distributes user data across storage nodes housed within a chassis, using erasure coding and redundant copies of metadata. Erasure coding refers to a method of data protection or reconstruction in which data is stored across a set of different locations, such as disks, storage nodes or geographic locations. Flash memory is one type of solid-state memory that may be integrated with the embodiments, although the embodiments may be extended to other types of solid-state memory or other storage medium, including non-solid state memory. Control of storage locations and workloads are distributed across the storage locations in a clustered peer-to-peer system. Tasks such as mediating communications between the various storage nodes, detecting when a storage node has become unavailable, and balancing I/Os (inputs and outputs) across the various storage nodes, are all handled on a distributed basis. Data is laid out or distributed across multiple storage nodes in data fragments or stripes that support data recovery in some embodiments. Ownership of data can be reassigned within a cluster, independent of input and output patterns. This architecture described in more detail below allows a storage node in the cluster to fail, with the system remaining operational, since the data can be reconstructed from other storage nodes and thus remain available for input and output operations. In various embodiments, a storage node may be referred to as a cluster node, a blade, or a server.

The storage cluster is contained within a chassis, i.e., an enclosure housing one or more storage nodes. A mechanism to provide power to each storage node, such as a power distribution bus, and a communication mechanism, such as a communication bus that enables communication between the storage nodes are included within the chassis. The storage cluster can run as an independent system in one location according to some embodiments. In one embodiment, a chassis contains at least two instances of both the power distribution and the communication bus which may be enabled or disabled independently. The internal communication bus may be an Ethernet bus, however, other technologies such as Peripheral Component Interconnect (PCI) Express, InfiniBand, and others, are equally suitable. The chassis provides a port for an external communication bus for enabling communication between multiple chassis, directly or through a switch, and with client systems. The external communication may use a technology such as Ethernet, InfiniBand, Fibre Channel, etc. In some embodiments, the external communication bus uses different communication bus technologies for inter-chassis and client communication. If a switch is deployed within or between chassis, the switch may act as a translation between multiple protocols or technologies. When multiple chassis are connected to define a storage cluster, the storage cluster may be accessed by a client using either proprietary interfaces or standard interfaces such as network file system (NFS), common internet file system (CIFS), small computer system interface (SCSI) or hypertext transfer protocol (HTTP). Translation from the client protocol may occur at the switch, chassis external communication bus or within each storage node.

Each storage node may be one or more storage servers and each storage server is connected to one or more non-volatile solid state memory units, which may be referred to as storage units or storage devices. One embodiment includes a single storage server in each storage node and between one to eight non-volatile solid state memory units, however this one example is not meant to be limiting. The storage server may include a processor, dynamic random access memory (DRAM) and interfaces for the internal communication bus and power distribution for each of the power buses. Inside the storage node, the interfaces and storage unit share a communication bus, e.g., PCI Express, in some embodiments. The non-volatile solid state memory units may directly access the internal communication bus interface through a storage node communication bus, or request the storage node to access the bus interface. The non-volatile solid state memory unit contains an embedded central processing unit (CPU), solid state storage controller, and a quantity of solid state mass storage, e.g., between 2-32 terabytes (TB) in some embodiments. An embedded volatile storage medium, such as DRAM, and an energy reserve apparatus are included in the non-volatile solid state memory unit. In some embodiments, the energy reserve apparatus is a capacitor, super-capacitor, or battery that enables transferring a subset of DRAM contents to a stable storage medium in the case of power loss. In some embodiments, the non-volatile solid state memory unit is constructed with a storage class memory, such as phase change or magnetoresistive random access memory (MRAM) that substitutes for DRAM and enables a reduced power hold-up apparatus.

One of many features of the storage nodes and non-volatile solid state storage is the ability to proactively rebuild data in a storage cluster. The storage nodes and non-volatile solid state storage can determine when a storage node or non-volatile solid state storage in the storage cluster is unreachable, independent of whether there is an attempt to read data involving that storage node or non-volatile solid state storage. The storage nodes and non-volatile solid state storage then cooperate to recover and rebuild the data in at least partially new locations. This constitutes a proactive rebuild, in that the system rebuilds data without waiting until the data is needed for a read access initiated from a client system employing the storage cluster. These and further details of the storage memory and operation thereof are discussed below.

FIG. 1 is a perspective view of a storage cluster 160, with multiple storage nodes 150 and internal solid-state memory coupled to each storage node to provide network attached storage or storage area network, in accordance with some embodiments. A network attached storage, storage area network, or a storage cluster, or other storage memory, could include one or more storage clusters 160, each having one or more storage nodes 150, in a flexible and reconfigurable arrangement of both the physical components and the amount of storage memory provided thereby. The storage cluster 160 is designed to fit in a rack, and one or more racks can be set up and populated as desired for the storage memory. The storage cluster 160 has a chassis 138 having multiple slots 142. It should be appreciated that chassis 138 may be referred to as a housing, enclosure, or rack unit. In one embodiment, the chassis 138 has fourteen slots 142, although other numbers of slots are readily devised. For example, some embodiments have four slots, eight slots, sixteen slots, thirty-two slots, or other suitable number of slots. Each slot 142 can accommodate one storage node 150 in some embodiments. Chassis 138 includes flaps 148 that can be utilized to mount the chassis 138 on a rack. Fans 144 provide air circulation for cooling of the storage nodes 150 and components thereof, although other cooling components could be used, or an embodiment could be devised without cooling components. A switch fabric 146 couples storage nodes 150 within chassis 138 together and to a network for communication to the memory. In an embodiment depicted in FIG. 1, the slots 142 to the left of the switch fabric 146 and fans 144 are shown occupied by storage nodes 150, while the slots 142 to the right of the switch fabric 146 and fans 144 are empty and available for insertion of storage node 150 for illustrative purposes. This configuration is one example, and one or more storage nodes 150 could occupy the slots 142 in various further arrangements. The storage node arrangements need not be sequential or adjacent in some embodiments. Storage nodes 150 are hot pluggable, meaning that a storage node 150 can be inserted into a slot 142 in the chassis 138, or removed from a slot 142, without stopping or powering down the system. Upon insertion or removal of storage node 150 from slot 142, the system automatically reconfigures in order to recognize and adapt to the change. Reconfiguration, in some embodiments, includes restoring redundancy and/or rebalancing data or load.

Each storage node 150 can have multiple components. In the embodiment shown here, the storage node 150 includes a printed circuit board 158 populated by a CPU 156, i.e., processor, a memory 154 coupled to the CPU 156, and a non-volatile solid state storage 152 coupled to the CPU 156, although other mountings and/or components could be used in further embodiments. The memory 154 has instructions which are executed by the CPU 156 and/or data operated on by the CPU 156. As further explained below, the non-volatile solid state storage 152 includes flash or, in further embodiments, other types of solid-state memory.

Referring to FIG. 1, storage cluster 160 is scalable, meaning that storage capacity with non-uniform storage sizes is readily added, as described above. One or more storage nodes 150 can be plugged into or removed from each chassis and the storage cluster self-configures in some embodiments. Plug-in storage nodes 150, whether installed in a chassis as delivered or later added, can have different sizes. For example, in one embodiment a storage node 150 can have any multiple of 4 TB, e.g., 8 TB, 12 TB, 16 TB, 32 TB, etc. In further embodiments, a storage node 150 could have any multiple of other storage amounts or capacities. Storage capacity of each storage node 150 is broadcast, and influences decisions of how to stripe the data. For maximum storage efficiency, an embodiment can self-configure as wide as possible in the stripe, subject to a predetermined requirement of continued operation with loss of up to one, or up to two, non-volatile solid state storage units 152 or storage nodes 150 within the chassis.

Figure 2:
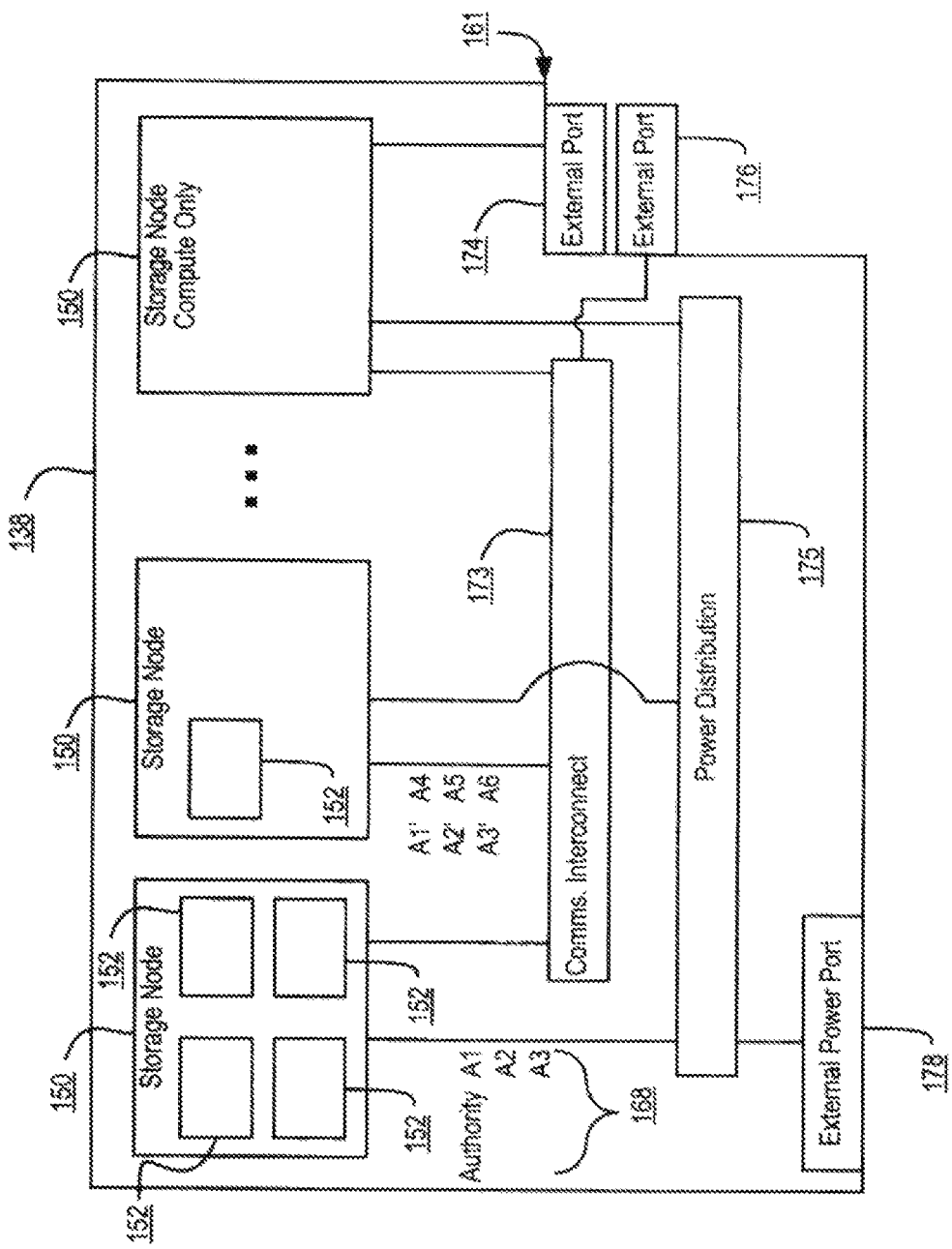
FIG. 2 is a block diagram showing an interconnect switch coupling multiple storage nodes in accordance with some embodiments.

FIG. 2 is a block diagram showing a communications interconnect 170 and power distribution bus 172 coupling multiple storage nodes 150. Referring back to FIG. 1, the communications interconnect 170 can be included in or implemented with the switch fabric 146 in some embodiments. Where multiple storage clusters 160 occupy a rack, the communications interconnect 170 can be included in or implemented with a top of rack switch, in some embodiments. As illustrated in FIG. 2, storage cluster 160 is enclosed within a single chassis 138. External port 176 is coupled to storage nodes 150 through communications interconnect 170, while external port 174 is coupled directly to a storage node. External power port 178 is coupled to power distribution bus 172. Storage nodes 150 may include varying amounts and differing capacities of non-volatile solid state storage 152 as described with reference to FIG. 1. In addition, one or more storage nodes 150 may be a compute only storage node as illustrated in FIG. 2. Authorities 168 are implemented on the non-volatile solid state storages 152, for example as lists or other data structures stored in memory. In some embodiments the authorities are stored within the non-volatile solid state storage 152 and supported by software executing on a controller or other processor of the non-volatile solid state storage 152. In a further embodiment, authorities 168 are implemented on the storage nodes 150, for example as lists or other data structures stored in the memory 154 and supported by software executing on the CPU 156 of the storage node 150. Authorities 168 control how and where data is stored in the non-volatile solid state storages 152 in some embodiments. This control assists in determining which type of erasure coding scheme is applied to the data, and which storage nodes 150 have which portions of the data. Each authority 168 may be assigned to a non-volatile solid state storage 152. Each authority may control a range of Mode numbers, segment numbers, or other data identifiers which are assigned to data by a file system, by the storage nodes 150, or by the non-volatile solid state storage 152, in various embodiments.

Every piece of data, and every piece of metadata, has redundancy in the system in some embodiments. In addition, every piece of data and every piece of metadata has an owner, which may be referred to as an authority. If that authority is unreachable, for example through failure of a storage node, there is a plan of succession for how to find that data or that metadata. In various embodiments, there are redundant copies of authorities 168. Authorities 168 have a relationship to storage nodes 150 and non-volatile solid state storage 152 in some embodiments. Each authority 168, covering a range of data segment numbers or other identifiers of the data, may be assigned to a specific non-volatile solid state storage 152. In some embodiments the authorities 168 for all of such ranges are distributed over the non-volatile solid state storages 152 of a storage cluster. Each storage node 150 has a network port that provides access to the non-volatile solid state storage(s) 152 of that storage node 150. Data can be stored in a segment, which is associated with a segment number and that segment number is an indirection for a configuration of a RAID (redundant array of independent disks) stripe in some embodiments. The assignment and use of the authorities 168 thus establishes an indirection to data. Indirection may be referred to as the ability to reference data indirectly, in this case via an authority 168, in accordance with some embodiments. A segment identifies a set of non-volatile solid state storage 152 and a local identifier into the set of non-volatile solid state storage 152 that may contain data. In some embodiments, the local identifier is an offset into the device and may be reused sequentially by multiple segments. In other embodiments the local identifier is unique for a specific segment and never reused. The offsets in the non-volatile solid state storage 152 are applied to locating data for writing to or reading from the non-volatile solid state storage 152 (in the form of a RAID stripe). Data is striped across multiple units of non-volatile solid state storage 152, which may include or be different from the non-volatile solid state storage 152 having the authority 168 for a particular data segment.

If there is a change in where a particular segment of data is located, e.g., during a data move or a data reconstruction, the authority 168 for that data segment should be consulted, at that non-volatile solid state storage 152 or storage node 150 having that authority 168. In order to locate a particular piece of data, embodiments calculate a hash value for a data segment or apply an Mode number or a data segment number. The output of this operation points to a non-volatile solid state storage 152 having the authority 168 for that particular piece of data. In some embodiments there are two stages to this operation. The first stage maps an entity identifier (ID), e.g., a segment number, Mode number, or directory number to an authority identifier. This mapping may include a calculation such as a hash or a bit mask. The second stage is mapping the authority identifier to a particular non-volatile solid state storage 152, which may be done through an explicit mapping. The operation is repeatable, so that when the calculation is performed, the result of the calculation repeatably and reliably points to a particular non-volatile solid state storage 152 having that authority 168. The operation may include the set of reachable storage nodes as input. If the set of reachable non-volatile solid state storage units changes the optimal set changes. In some embodiments, the persisted value is the current assignment (which is always true) and the calculated value is the target assignment the cluster will attempt to reconfigure towards. This calculation may be used to determine the optimal non-volatile solid state storage 152 for an authority in the presence of a set of non-volatile solid state storage 152 that are reachable and constitute the same cluster. The calculation also determines an ordered set of peer non-volatile solid state storage 152 that will also record the authority to non-volatile solid state storage mapping so that the authority may be determined even if the assigned non-volatile solid state storage is unreachable. A duplicate or substitute authority 168 may be consulted if a specific authority 168 is unavailable in some embodiments.

With reference to FIGS. 1 and 2, two of the many tasks of the CPU 156 on a storage node 150 are to break up write data, and reassemble read data. When the system has determined that data is to be written, the authority 168 for that data is located as above. When the segment ID for data is already determined the request to write is forwarded to the non-volatile solid state storage 152 currently determined to be the host of the authority 168 determined from the segment. The host CPU 156 of the storage node 150, on which the non-volatile solid state storage 152 and corresponding authority 168 reside, then breaks up or shards the data and transmits the data out to various non-volatile solid state storage 152. The transmitted data is written as a data stripe in accordance with an erasure coding scheme. In some embodiments, data is requested to be pulled, and in other embodiments, data is pushed. In reverse, when data is read, the authority 168 for the segment ID containing the data is located as described above. The host CPU 156 of the storage node 150 on which the non-volatile solid state storage 152 and corresponding authority 168 reside requests the data from the non-volatile solid state storage and corresponding storage nodes pointed to by the authority. In some embodiments the data is read from flash storage as a data stripe. The host CPU 156 of storage node 150 then reassembles the read data, correcting any errors (if present) according to the appropriate erasure coding scheme, and forwards the reassembled data to the network. In further embodiments, some or all of these tasks can be handled in the non-volatile solid state storage 152. In some embodiments, the segment host requests the data be sent to storage node 150 by requesting pages from storage and then sending the data to the storage node making the original request.

In some systems, for example in UNIX-style file systems, data is handled with an index node or Mode, which specifies a data structure that represents an object in a file system. The object could be a file or a directory, for example. Metadata may accompany the object, as attributes such as permission data and a creation timestamp, among other attributes. A segment number could be assigned to all or a portion of such an object in a file system. In other systems, data segments are handled with a segment number assigned elsewhere. For purposes of discussion, the unit of distribution is an entity, and an entity can be a file, a directory or a segment. That is, entities are units of data or metadata stored by a storage system. Entities are grouped into sets called authorities. Each authority has an authority owner, which is a storage node that has the exclusive right to update the entities in the authority. In other words, a storage node contains the authority, and that the authority, in turn, contains entities.

A segment is a logical container of data in accordance with some embodiments. A segment is an address space between medium address space and physical flash locations, i.e., the data segment number, are in this address space. Segments may also contain meta-data, which enable data redundancy to be restored (rewritten to different flash locations or devices) without the involvement of higher level software. In one embodiment, an internal format of a segment contains client data and medium mappings to determine the position of that data. Each data segment is protected, e.g., from memory and other failures, by breaking the segment into a number of data and parity shards, where applicable. The data and parity shards are distributed, i.e., striped, across non-volatile solid state storage 152 coupled to the host CPUs 156 (See FIG. 5) in accordance with an erasure coding scheme. Usage of the term segments refers to the container and its place in the address space of segments in some embodiments. Usage of the term stripe refers to the same set of shards as a segment and includes how the shards are distributed along with redundancy or parity information in accordance with some embodiments.

A series of address-space transformations takes place across an entire storage system. At the top are the directory entries (file names) which link to an inode. Inodes point into medium address space, where data is logically stored. Medium addresses may be mapped through a series of indirect mediums to spread the load of large files, or implement data services like deduplication or snapshots. Medium addresses may be mapped through a series of indirect mediums to spread the load of large files, or implement data services like deduplication or snapshots. Segment addresses are then translated into physical flash locations. Physical flash locations have an address range bounded by the amount of flash in the system in accordance with some embodiments. Medium addresses and segment addresses are logical containers, and in some embodiments use a 128 bit or larger identifier so as to be practically infinite, with a likelihood of reuse calculated as longer than the expected life of the system. Addresses from logical containers are allocated in a hierarchical fashion in some embodiments. Initially, each non-volatile solid state storage unit 152 may be assigned a range of address space. Within this assigned range, the non-volatile solid state storage 152 is able to allocate addresses without synchronization with other non-volatile solid state storage 152.

Data and metadata is stored by a set of underlying storage layouts that are optimized for varying workload patterns and storage devices. These layouts incorporate multiple redundancy schemes, compression formats and index algorithms Some of these layouts store information about authorities and authority masters, while others store file metadata and file data. The redundancy schemes include error correction codes that tolerate corrupted bits within a single storage device (such as a NAND flash chip), erasure codes that tolerate the failure of multiple storage nodes, and replication schemes that tolerate data center or regional failures. In some embodiments, low density parity check (LDPC) code is used within a single storage unit. Reed-Solomon encoding is used within a storage cluster, and mirroring is used within a storage grid in some embodiments. Metadata may be stored using an ordered log structured index (such as a Log Structured Merge Tree), and large data may not be stored in a log structured layout.

In order to maintain consistency across multiple copies of an entity, the storage nodes agree implicitly on two things through calculations: (1) the authority that contains the entity, and (2) the storage node that contains the authority. The assignment of entities to authorities can be done by pseudo randomly assigning entities to authorities, by splitting entities into ranges based upon an externally produced key, or by placing a single entity into each authority. Examples of pseudorandom schemes are linear hashing and the Replication Under Scalable Hashing (RUSH) family of hashes, including Controlled Replication Under Scalable Hashing (CRUSH). In some embodiments, pseudo-random assignment is utilized only for assigning authorities to nodes because the set of nodes can change. The set of authorities cannot change so any subjective function may be applied in these embodiments. Some placement schemes automatically place authorities on storage nodes, while other placement schemes rely on an explicit mapping of authorities to storage nodes. In some embodiments, a pseudorandom scheme is utilized to map from each authority to a set of candidate authority owners. A pseudorandom data distribution function related to CRUSH may assign authorities to storage nodes and create a list of where the authorities are assigned. Each storage node has a copy of the pseudorandom data distribution function, and can arrive at the same calculation for distributing, and later finding or locating an authority. Each of the pseudorandom schemes requires the reachable set of storage nodes as input in some embodiments in order to conclude the same target nodes. Once an entity has been placed in an authority, the entity may be stored on physical devices so that no expected failure will lead to unexpected data loss. In some embodiments, rebalancing algorithms attempt to store the copies of all entities within an authority in the same layout and on the same set of machines.

Examples of expected failures include device failures, stolen machines, datacenter fires, and regional disasters, such as nuclear or geological events. Different failures lead to different levels of acceptable data loss. In some embodiments, a stolen storage node impacts neither the security nor the reliability of the system, while depending on system configuration, a regional event could lead to no loss of data, a few seconds or minutes of lost updates, or even complete data loss.

In the embodiments, the placement of data for storage redundancy is independent of the placement of authorities for data consistency. In some embodiments, storage nodes that contain authorities do not contain any persistent storage. Instead, the storage nodes are connected to non-volatile solid state storage units that do not contain authorities. The communications interconnect between storage nodes and non-volatile solid state storage units consists of multiple communication technologies and has non-uniform performance and fault tolerance characteristics. In some embodiments, as mentioned above, non-volatile solid state storage units are connected to storage nodes via PCI express, storage nodes are connected together within a single chassis using Ethernet backplane, and chassis are connected together to form a storage cluster. Storage clusters are connected to clients using Ethernet or fiber channel in some embodiments. If multiple storage clusters are configured into a storage grid, the multiple storage clusters are connected using the Internet or other long-distance networking links, such as a "metro scale" link or private link that does not traverse the internet.

Authority owners have the exclusive right to modify entities, to migrate entities from one non-volatile solid state storage unit to another non-volatile solid state storage unit, and to add and remove copies of entities. This allows for maintaining the redundancy of the underlying data. When an authority owner fails, is going to be decommissioned, or is overloaded, the authority is transferred to a new storage node. Transient failures make it non-trivial to ensure that all non-faulty machines agree upon the new authority location. The ambiguity that arises due to transient failures can be achieved automatically by a consensus protocol such as Paxos, hot-warm failover schemes, via manual intervention by a remote system administrator, or by a local hardware administrator (such as by physically removing the failed machine from the cluster, or pressing a button on the failed machine). In some embodiments, a consensus protocol is used, and failover is automatic. If too many failures or replication events occur in too short a time period, the system goes into a self-preservation mode and halts replication and data movement activities until an administrator intervenes in accordance with some embodiments.

As authorities are transferred between storage nodes and authority owners update entities in their authorities, the system transfers messages between the storage nodes and non-volatile solid state storage units. With regard to persistent messages, messages that have different purposes are of different types. Depending on the type of the message, the system maintains different ordering and durability guarantees. As the persistent messages are being processed, the messages are temporarily stored in multiple durable and non-durable storage hardware technologies. In some embodiments, messages are stored in RAM, NVRAM and on NAND flash devices, and a variety of protocols are used in order to make efficient use of each storage medium. Latency-sensitive client requests may be persisted in replicated NVRAM, and then later NAND, while background rebalancing operations are persisted directly to NAND.

Persistent messages are persistently stored prior to being trasmitted. This allows the system to continue to serve client requests despite failures and component replacement. Although many hardware components contain unique identifiers that are visible to system administrators, manufacturer, hardware supply chain and ongoing monitoring quality control infrastructure, applications running on top of the infrastructure address virtualize addresses. These virtualized addresses do not change over the lifetime of the storage system, regardless of component failures and replacements. This allows each component of the storage system to be replaced over time without reconfiguration or disruptions of client request processing.

In some embodiments, the virtualized addresses are stored with sufficient redundancy. A continuous monitoring system correlates hardware and software status and the hardware identifiers. This allows detection and prediction of failures due to faulty components and manufacturing details. The monitoring system also enables the proactive transfer of authorities and entities away from impacted devices before failure occurs by removing the component from the critical path in some embodiments.

Figure 3:
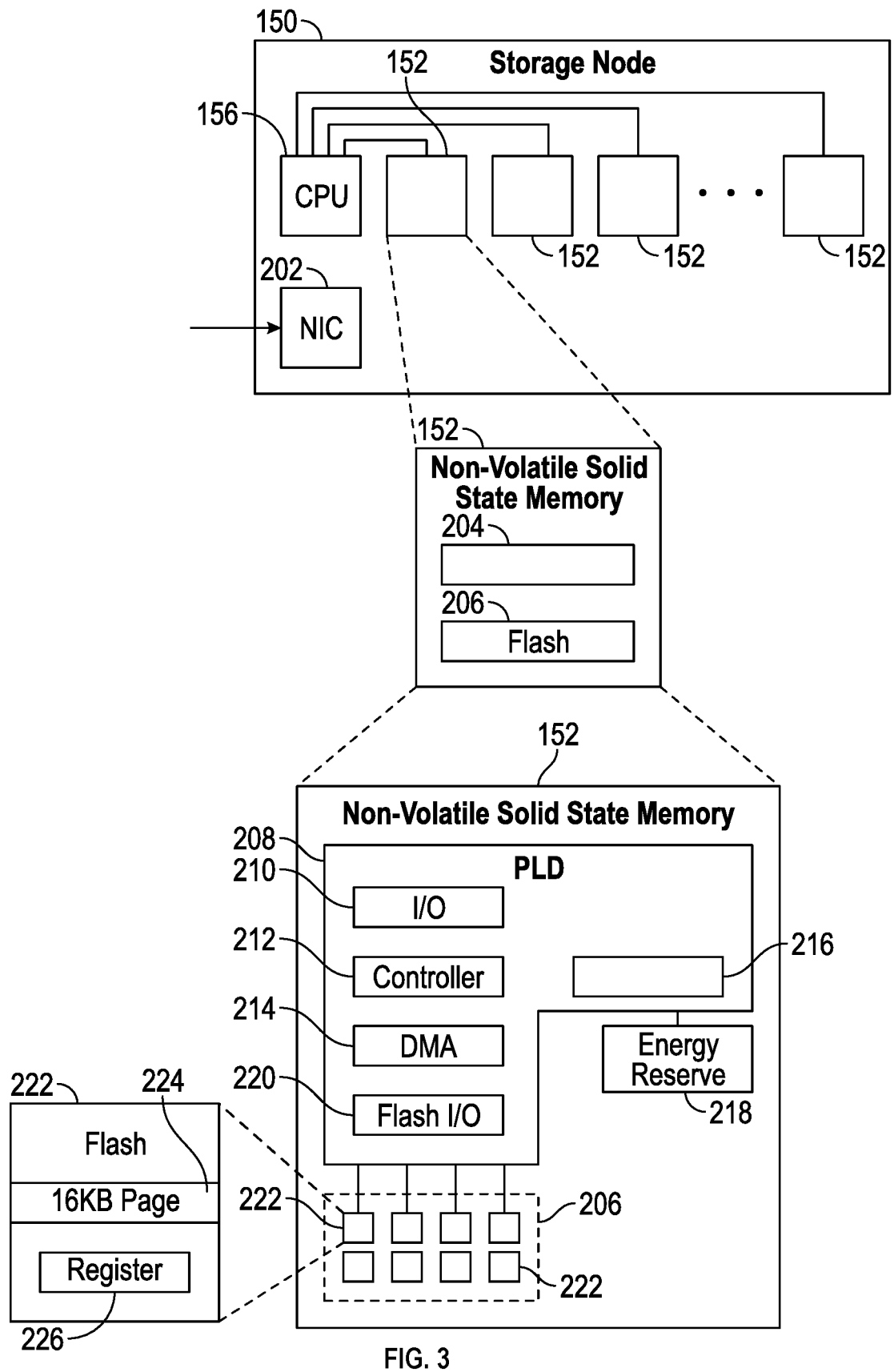
FIG. 3 is a multiple level block diagram, showing contents of a storage node and contents of one of the non-volatile solid state storage units in accordance with some embodiments.

FIG. 3 is a multiple level block diagram, showing contents of a storage node 150 and contents of a non-volatile solid state storage 152 of the storage node 150. Data is communicated to and from the storage node 150 by a network interface controller (NIC) 202 in some embodiments. Each storage node 150 has a CPU 156, and one or more non-volatile solid state storage 152, as discussed above. Moving down one level in FIG. 3, each non-volatile solid state storage 152 has a relatively fast non-volatile solid state memory, such as nonvolatile random access memory (NVRAM) 204, and flash memory 206. In some embodiments, NVRAM 204 may be a component that does not require program/erase cycles (DRAM, MRAM, PCM), and can be a memory that can support being written vastly more often than the memory is read from. Moving down another level in FIG. 3, the NVRAM 204 is implemented in one embodiment as high speed volatile memory, such as dynamic random access memory (DRAM) 216, backed up by energy reserve 218. Energy reserve 218 provides sufficient electrical power to keep the DRAM 216 powered long enough for contents to be transferred to the flash memory 206 in the event of power failure. In some embodiments, energy reserve 218 is a capacitor, super-capacitor, battery, or other device, that supplies a suitable supply of energy sufficient to enable the transfer of the contents of DRAM 216 to a stable storage medium in the case of power loss. The flash memory 206 is implemented as multiple flash dies 222, which may be referred to as packages of flash dies 222 or an array of flash dies 222. It should be appreciated that the flash dies 222 could be packaged in any number of ways, with a single die per package, multiple dies per package (i.e. multichip packages), in hybrid packages, as bare dies on a printed circuit board or other substrate, as encapsulated dies, etc. In the embodiment shown, the non-volatile solid state storage 152 has a controller 212 or other processor, and an input output (I/O) port 210 coupled to the controller 212. I/O port 210 is coupled to the CPU 156 and/or the network interface controller 202 of the flash storage node 150. Flash input output (I/O) port 220 is coupled to the flash dies 222, and a direct memory access unit (DMA) 214 is coupled to the controller 212, the DRAM 216 and the flash dies 222. In the embodiment shown, the I/O port 210, controller 212, DMA unit 214 and flash I/O port 220 are implemented on a programmable logic device (PLD) 208, e.g., a field programmable gate array (FPGA). In this embodiment, each flash die 222 has pages, organized as sixteen kB (kilobyte) pages 224, and a register 226 through which data can be written to or read from the flash die 222. In further embodiments, other types of solid-state memory are used in place of, or in addition to flash memory illustrated within flash die 222.

Storage clusters 160, in various embodiments as disclosed herein, can be contrasted with storage arrays in general. The storage nodes 150 are part of a collection that creates the storage cluster 160. Each storage node 150 owns a slice of data and computing required to provide the data. Multiple storage nodes 150 cooperate to store and retrieve the data. Storage memory or storage devices, as used in storage arrays in general, are less involved with processing and manipulating the data. Storage memory or storage devices in a storage array receive commands to read, write, or erase data. The storage memory or storage devices in a storage array are not aware of a larger system in which they are embedded, or what the data means. Storage memory or storage devices in storage arrays can include various types of storage memory, such as RAM, solid state drives, hard disk drives, etc. The storage units 152 described herein have multiple interfaces active simultaneously and serving multiple purposes. In some embodiments, some of the functionality of a storage node 150 is shifted into a storage unit 152, transforming the storage unit 152 into a combination of storage unit 152 and storage node 150. Placing computing (relative to storage data) into the storage unit 152 places this computing closer to the data itself. The various system embodiments have a hierarchy of storage node layers with different capabilities. By contrast, in a storage array, a controller owns and knows everything about all of the data that the controller manages in a shelf or storage devices. In a storage cluster 160, as described herein, multiple controllers in multiple storage units 152 and/or storage nodes 150 cooperate in various ways (e.g., for erasure coding, data sharding, metadata communication and redundancy, storage capacity expansion or contraction, data recovery, and so on).

Figure 4:
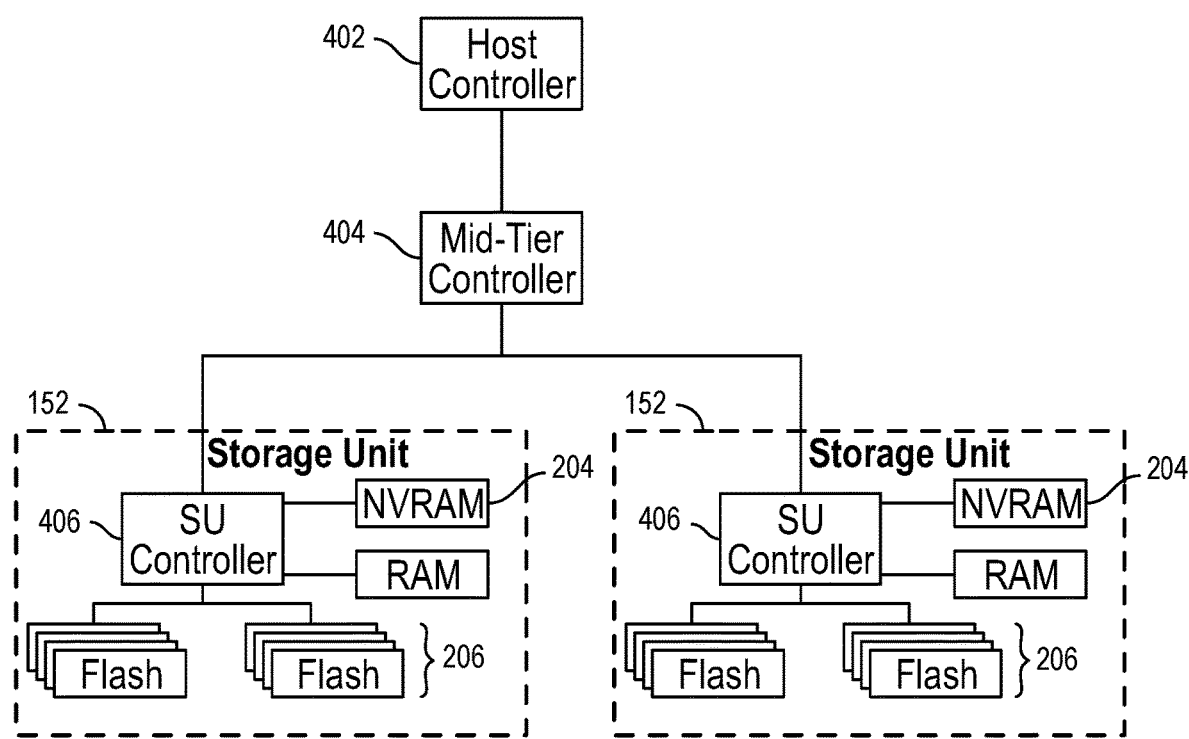
FIG. 4 shows a storage server environment, which may utilize the embodiments of the storage nodes and storage units of FIGS. 1-3.

FIG. 4 shows a storage server environment, which uses embodiments of the storage nodes 150 and storage units 152 of FIGS. 1-3. In this version, each storage unit 152 has a processor such as controller 212 (see FIG. 3), an FPGA (field programmable gate array), flash memory 206, and NVRAM 204 (which may be super-capacitor backed DRAM 216, see FIG. 3) on a PCIe (peripheral component interconnect express) board in a chassis 138 (see FIG. 1). The storage unit 152 may be implemented as a single board containing storage, and may be the largest tolerable failure domain inside the chassis. In some embodiments, up to two storage units 152 may fail and the device will continue with no data loss.

The physical storage is divided into named regions based on application usage in some embodiments. The NVRAM 204 is a contiguous block of reserved memory in the storage unit 152 DRAM 216, and is backed by NAND flash. NVRAM 204 is logically divided into multiple memory regions written for two as spool (e.g., spool_region). Space within the NVRAM 204 spools is managed by each authority 512 independently. Each device provides an amount of storage space to each authority 512. That authority 512 further manages lifetimes and allocations within that space. Examples of a spool include distributed transactions or notions. When the primary power to a storage unit 152 fails, onboard super-capacitors provide a short duration of power hold up. During this holdup interval, the contents of the NVRAM 204 are flushed to flash memory 206. On the next power-on, the contents of the NVRAM 204 are recovered from the flash memory 206.

As for the storage unit controller, the responsibility of the logical "controller" is distributed across each of the blades containing authorities 512. This distribution of logical control is shown in FIG. 4 as a host controller 402, mid-tier controller 404 and storage unit controller(s) 406. Management of the control plane and the storage plane are treated independently, although parts may be physically co-located on the same blade. Each authority 512 effectively serves as an independent controller. Each authority 512 provides its own data and metadata structures, its own background workers, and maintains its own lifecycle.

Figure 5:
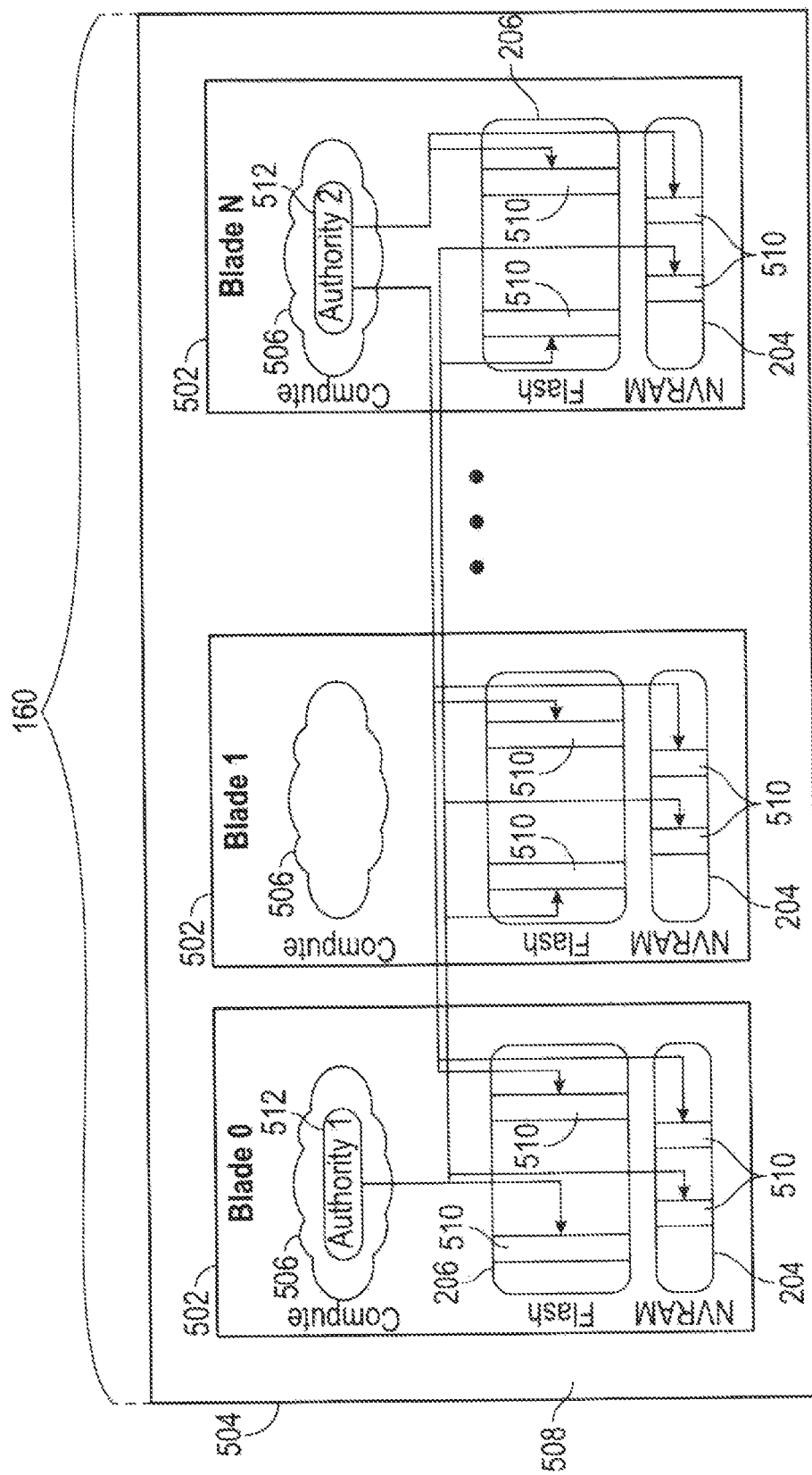
FIG. 5 is a blade hardware block diagram, showing a control plane, compute and storage planes, and authorities interacting with underlying physical resources to perform distributed transactions, using embodiments of the storage nodes and storage units of FIGS. 1-3 in the storage server environment of FIG. 4 in accordance with some embodiments.

FIG. 5 is a blade 502 hardware block diagram, showing a control plane 504, compute and storage planes 506, 508, and authorities 512 interacting with underlying physical resources to perform distributed transactions, using embodiments of the storage nodes 150 and storage units 152 of FIGS. 1-3 in the storage server environment of FIG. 4. The control plane 504 is partitioned into a number of authorities 512 which can use the compute resources in the compute plane 506 to run on any of the blades 502. The storage plane 508 is partitioned into a set of devices, each of which provides access to flash 206 and NVRAM 204 resources. In the compute and storage planes 506, 508 of FIG. 5, the authorities 512 interact with the underlying physical resources (i.e., devices). From the point of view of an authority 512, its resources are striped over all of the physical devices. From the point of view of a device, it provides resources to all authorities 512, irrespective of where the authorities happen to run. In order to communicate and represent the ownership of an authority 402, including the right to record persistent changes on behalf of that authority 402, the authority 402 provides some evidence of authority ownership that can be independently verifiable. A token is employed for this purpose and function in one embodiment, although other techniques are readily devised.

Still referring to FIG. 5, each authority 512 has allocated or has been allocated one or more partitions 510 of storage memory in the storage units 152, e.g. partitions 510 in flash memory 206 and NVRAM 204. Each authority 512 uses those allocated partitions 510 that belong to it, for writing or reading user data. Authorities can be associated with differing amounts of physical storage of the system. For example, one authority 512 could have a larger number of partitions 510 or larger sized partitions 510 in one or more storage units 152 than one or more other authorities 512. The above-described storage systems and storage clusters, and variations thereof, and various further storage systems and storage clusters are suitable for distributed flash wear leveling, as described below with reference to FIGS. 6-13. It should be appreciated that, although described with flash memory, the teachings herein are applicable to other types of solid-state memory and other types of storage memory.

Figure 6:
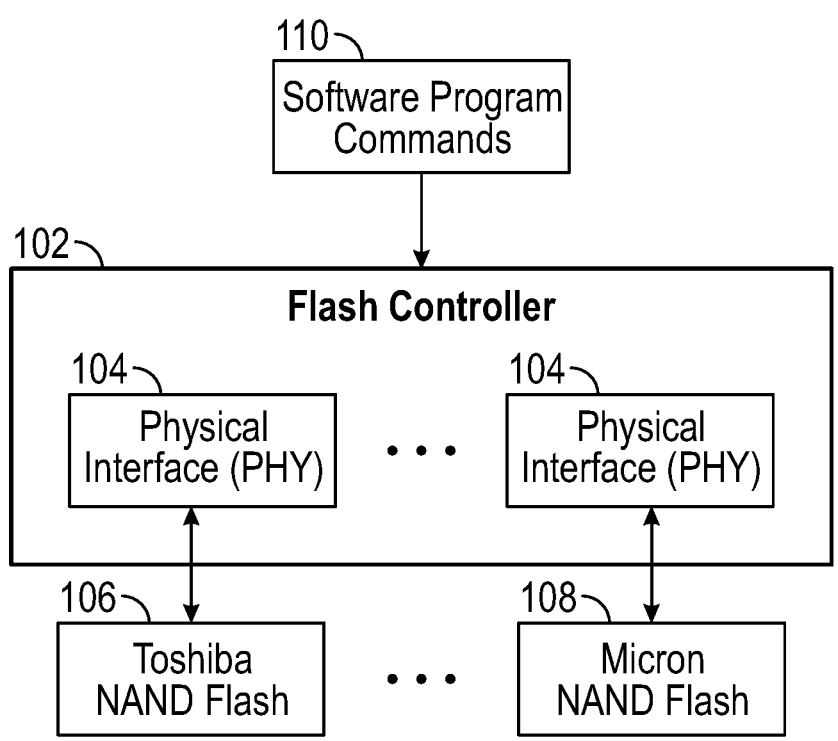
FIG. 6 depicts a flash controller that is configurable to couple to flash memories with differing flash memory device interfaces in accordance with some embodiments.

FIGS. 6 and 7 describe a multithreaded multimode NAND flash controller that can be used with multiple flash memory devices having the same or different flash memory interfaces, protocols, operating frequencies and/or signal timing, in various combinations and in various storage devices and systems. The flash controller can select from among multiple protocols, adjust and calibrate operating frequency and signal timing relative to each selected protocol and associated flash memory device interface, independently for each of multiple channels, and dynamically adapt signal rates to varying conditions that flash memory devices experience over time. Such tasks and capabilities are accomplished with a multithreaded and virtualized microcode sequence engine, individual channel configuration, and software calibrated I/O (input/output). Some embodiments can recalibrate signal rates (e.g., signal frequency and/or timing) to compensate for short-term drift the flash memory devices may experience as a result of environmental conditions such as temperature variation, power supply variation, noise, etc. Some embodiments can recalibrate signal rates to compensate for long-term drift or errors that flash memory devices may experience as a result of device wear arising from cumulative reads, cumulative writes, cumulative erasure cycles, etc.

There are fundamental differences between the ONFI and Toggle protocols in terms of physical flash signaling layer. The present flash controller design allows abstraction of much of the low-level complexity away from upper-level software. Upper-level software could, for example, issue "flash read" or "flash write" commands which in turn are processed differently by the controller depending upon the type of flash to which the controller is communicating. The physical controller could decode the command and translate the decoded command to the correct protocol, depending upon the type of flash and corresponding channel configuration.

FIG. 6 depicts a flash controller 102 that is configurable to couple to flash memories 106, 108 with differing flash memory device interfaces. In some embodiments, the flash controller 102 is implemented on a programmable logic device (PLD) or application-specific integrated circuit (ASIC), and includes a processor capable of multithreaded operation and various modules that can be implemented in circuitry, firmware, software executing on the processor, or various combinations thereof. Flash controller 102 corresponds to PLD 208 of FIG. 3 in some embodiments. Software program commands 110 are written into the flash controller 102, for example from an external device that has a processor. Each physical interface 104, or phy, is selectable as to protocol, operating frequency and signal timing, as appropriate to the specific NAND flash 106, 108 and associated flash memory device interface coupled to that physical interface 104. The physical interfaces 104 are independent of each other in the above and below-described selectability and tunability. In the example shown, one of the flash memory devices 106 is a Toshiba™ NAND flash, and another one of the flash memory devices 108 is a Micron™ NAND flash, but other flash memory devices from other manufacturers, or that have other flash memory interfaces and/or other protocols, could be used.

Figure 7A:
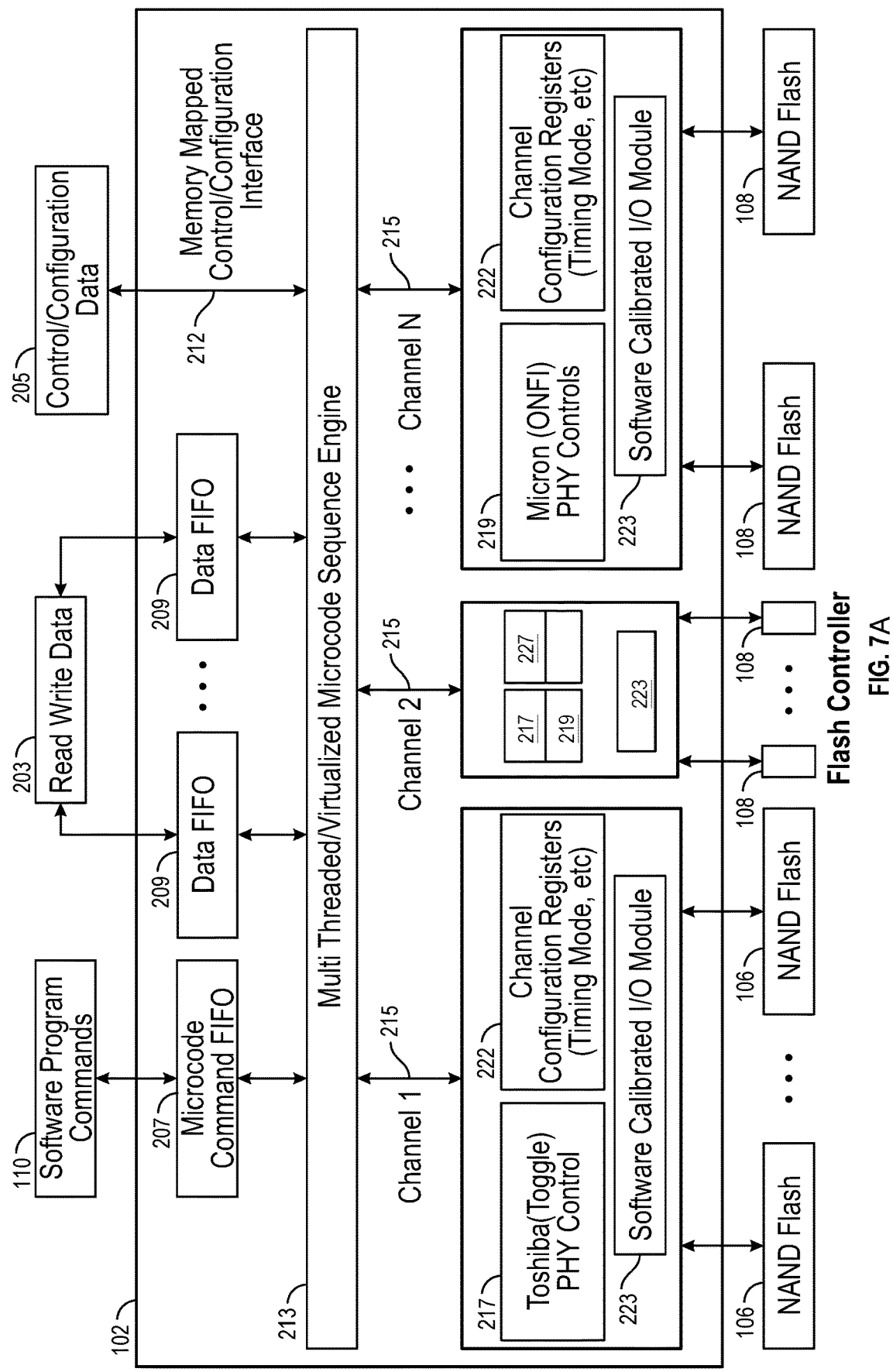
FIG. 7A is a block diagram showing structural details of an embodiment of the flash controller of FIG. 6, including a multithreaded/virtualized microcode sequence engine and multiple channels, each with phy controls, channel configuration registers and a software calibrated I/O module in accordance with some embodiments.

FIG. 7A is a block diagram showing structural details of an embodiment of the flash controller 102 of FIG. 6, including a multithreaded/virtualized microcode sequence engine 213 and multiple channels 215, each with phy (physical) controls 217, 219, channel configuration registers 221 and a software calibrated I/O module 223. An embodiment of the flash controller 102 is depicted with N channels 215, which could be two channels, three channels, four channels, etc., i.e., for N greater than or equal to two up to however many channels can be physically produced on physical device(s) for the flash controller 102. Each channel 215 is independent of each other channel 215, as to flash memory protocol, operating frequency and/or signal rates of the flash memory device interface, and signal timing relative to the selected flash memory protocol. It should be appreciated that signal rate, as used herein, is inclusive of frequency and/or signal timing. In FIG. 7A, the channel 215 labeled channel 1 is shown with Toshiba™ Toggle phy controls 217 (i.e., physical device controls for the Toggle protocol according to the Toshiba™ manufacturer flash devices), per the selected protocol for channel 1. Channel 1 is coupled to multiple NAND flash devices 106, which, in this example, are Toshiba™ flash memories that use the Toggle protocol. Channel configuration registers 221 for channel 1 are loaded with the appropriate values to direct the software calibrated I/O module 223 for channel 1 to time sequences in a protocol (e.g., by timing state machine states, microcode sequences or events, etc.) or to produce timed signals at a particular operating frequency (or signal rate) for the flash devices 106, in various embodiments. A process for how the channel configuration registers 221 are loaded, and a mechanism for how the software calibrated I/O module 223 generates timing for signal rates or generates signals in some embodiments.

Each channel 215 in the flash controller 102 has its own phy controls 217, 219, channel configuration registers 221 and software calibrated I/O module 223, the combination of which are selectable and tunable on an individual, per channel basis, as to protocol, operating frequency, and signal timing. The channel 215 labeled channel N is depicted as having Micron™ ONFI (Open NAND Flash Interface) phy controls 219 (i.e., physical device controls for the ONFI protocol according to the Micron™ manufacturer flash devices), per the selected protocol for channel N. Channel N is coupled to multiple NAND flash devices 108, which, in this example, are Micron™ flash memories that use the ONFI protocol. The flash controller 102 could be operated with flash devices 106 that are all the same (or flash devices 108 that are all the same, etc.), or mixes of flash devices 106, 108 of the various protocols, flash memory device interfaces and manufacturers. Each channel 215 should have the same flash memory devices across that channel 215, but which flash memory device and associated flash memory device interface that channel has is independent of each other channel.

Software program commands 110, which are device independent (i.e., not dependent on a particular flash memory protocol or flash memory device interface) are written by an external device (i.e., a device external to the flash controller 102), such as a processor, into the microcode command FIFO 207 of the flash controller 102. Read/write data 203 is read from or written into the data FIFOs 209. More specifically, write data intended for the flash memories is written into one or more write FIFOs, and read data from the flash memories is read from one or more read FIFOs, collectively illustrated as data FIFOs 209. A memory mapped control/configuration interface 211 is used for control/configuration data, which could also be from an external device such as a processor. The microcode command FIFO 207, the data FIFOs 209, and the memory mapped control/configuration interface 211 are coupled to the multithreaded/virtualized microcode sequence engine 213, which couples to the channels 215, e.g., channels 1 through N. Each channel 215 has a dedicated one or more threads, in a multithreaded operation of the multithreaded/virtualized microcode sequence engine 213. This multithreading virtualizes the microcode sequence engine 213, as if each channel 215 had its own microcode sequence engine 213. In further embodiments, there are multiple physical microcode sequence engines 213, e.g., in a multiprocessing multithreaded operation. This would still be considered an embodiment of the multithreaded/virtualized microcode sequence engine 213.

In some embodiments, state machines control the channels 215. These may act as the above-described virtualized microcode sequence engines 213. For example, in various embodiments, each channel has a state machine, or a state machine could control two channels, two state machines could control each channel, etc. These state machines could be implemented in hardware and fed by the multithreaded/virtualized microcode sequence engine 213, or implemented in threads of the multithreaded/virtualized microcode sequence engine 213, or combinations thereof. The functionality provided by the state machines is described in more detail below. In some embodiments, software injects commands into state machine queues, and state machines arbitrate for channels, then issue read or write commands to the channels, depending upon operations. In some embodiments, the state machines implement reads, writes and erases, with other commands such as reset, initialization sequences, feature settings, etc., communicated from an external processor along a bypass path which could be controlled by a register. Each state machine could have multiple states for a write, further states for a read, and still further states for erasure cycle(s), with timing and/or frequency (i.e., as affect signal rate) controlled by states, state transitions, and/or an embodiment of the software calibrated I/O module 223.

The microcode command FIFO 207 allows upstream logic to present transactions to the flash controller 102. The format of the command allows for the upstream logic to present entire transactions (with indicators for start of transaction, and end of transaction). The flash controller begins operating upon entire transactions on receipt of end of transaction markers, in some embodiments. In addition to the microcode command FIFO 207, there are two data FIFOs 209, and in some embodiments more than two, to handle data flowing in and out of flash. Also, there is a memory-mapped register interface 211 for the upstream logic to be able to program the different parameters used to set up the flash controller (e.g., calibration, flash mode, flash type, etc.) as described above.

Figure 7B:
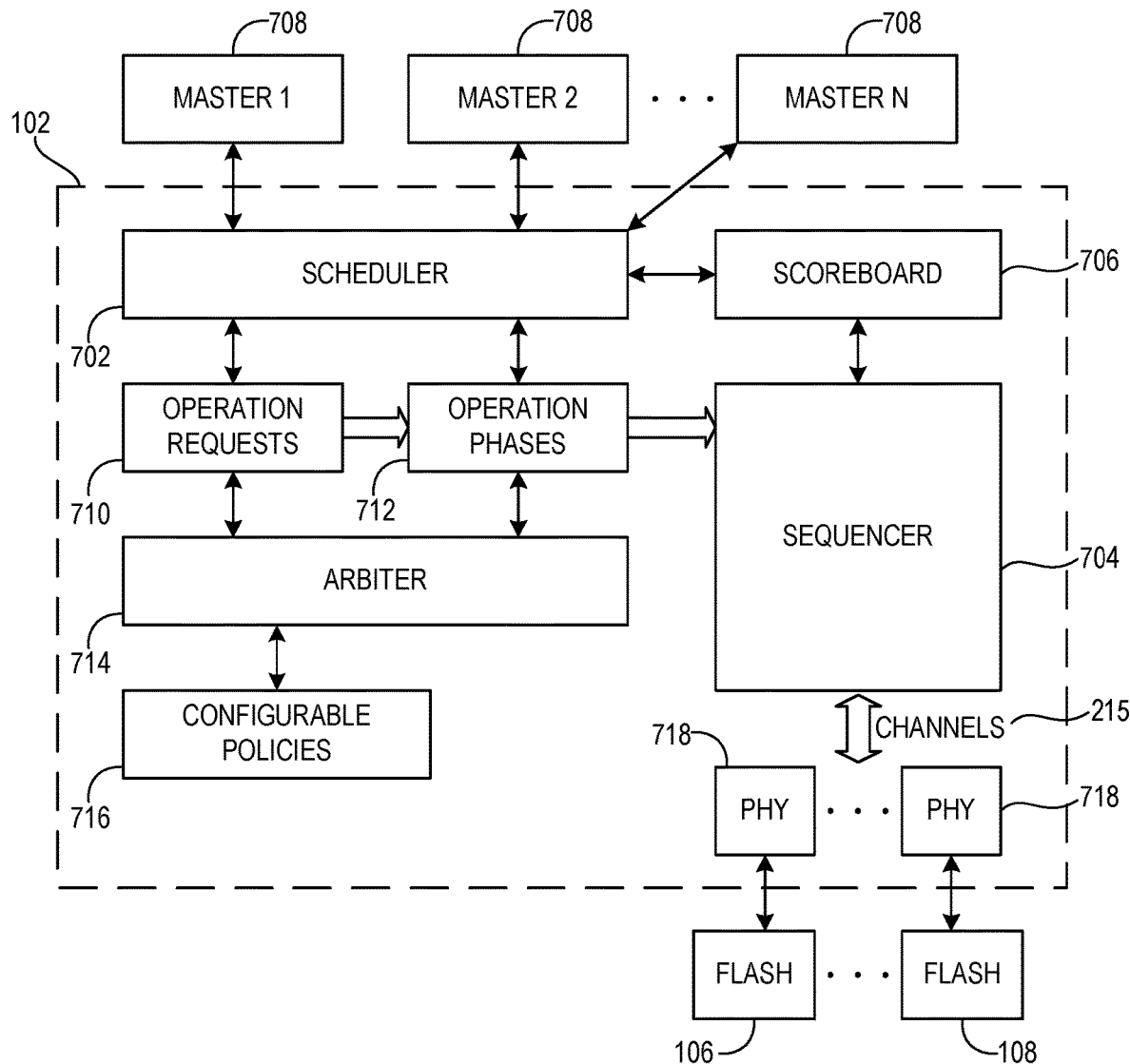
FIG. 7B is a block diagram showing further structural details of an embodiment of the flash controller of FIG. 6, including a scheduler with a scoreboard, an arbiter with configurable policies, and a sequencer with multiple channels each with a phy and flash memory.

FIG. 7B is a block diagram showing further structural details of an embodiment of the flash controller 102 of FIG. 6, including a scheduler 702 with a scoreboard 706, an arbiter 714 with configurable policies 716, and a sequencer 704 with multiple channels 215 each with a phy 718 and flash memory 106, 108. For optimal scheduling of flash operations, the scheduler 702 receives operation requests 710, such as read, write or erasure requests, from various masters 708. From each operation request 710, the scheduler forms a sequence of one or more operation phases 712. These masters 708 are, for example, storage nodes 150 or differing authorities 168 in various storage nodes 150 (including compute-only nodes) making I/O requests to a storage unit 152 that has the flash controller 102 in the storage unit 152. Examples of splitting operation requests into operation phases are further discussed below with reference to FIG. 10. The scheduler 702 includes the arbiter 714, which arbitrates the operation requests 710 and the operation phases 712, according to various configurable policies 716. These operation phases 712 are flash memory device independent commands, in some embodiments.

Policies 716 could specify priorities for operation requests 710 and operation phases 712, in various rules that depend on various factors such as arrival sequences, aging of requests or phases, origins of requests, memory conditions, etc., and could have optimization for latency, bandwidth or quality of service, etc. For example, one of the masters could have a faster path with higher priority in arbitration according to a policy, and another master could have a slower path with lower priority in arbitration according to another policy. Garbage collection would be an example of such a slower path with lower priority, and memory reads for a client expecting high quality of service would be an example of a faster path with higher priority. Another example is one master 708 performing read recovery with the scheduler 702 issuing operation phases 712 for varying a voltage threshold of a flash memory device through one of the channels 215, while the scheduler 702 is concurrently receiving and arbitrating another operation request 710 from another master 708 and issuing operation phases 712 to another flash memory device through another channel 215. The policies 716 are configurable in some embodiments, so that priorities for the arbiter 714 can be set and changed for various system operations and clients.

In some embodiments, the sequencer 704 includes the multithreaded/virtualized sequence engine 213 of FIG. 7A. In some embodiments, each phy 718 includes a single phy, or multiple phys, which could be differing phy controls 217, 219 as shown in FIG. 7A. The sequencer 704 receives the operation phases and communicates, through the phy 718, to flash memory according to the operation phases. For example, the sequencer 704 could operate one or more phy controls 217 to communicate to one type of flash memory 106, and operate one or more phy controls 219 to communicate to another type of flash memory 108, through the channels 215. These flash memory devices could have different types of flash memory device interfaces, as described above with reference to FIG. 7A, or they could all have the same type of flash memory device interface. The sequencer 704 produces the differing signaling for the differing types of flash memory device interfaces. The sequencer 704 uses the scoreboard 706, which can be implemented as a data structure in memory, to track status of each of the operation phases 712, in some embodiments.

Figure 8:
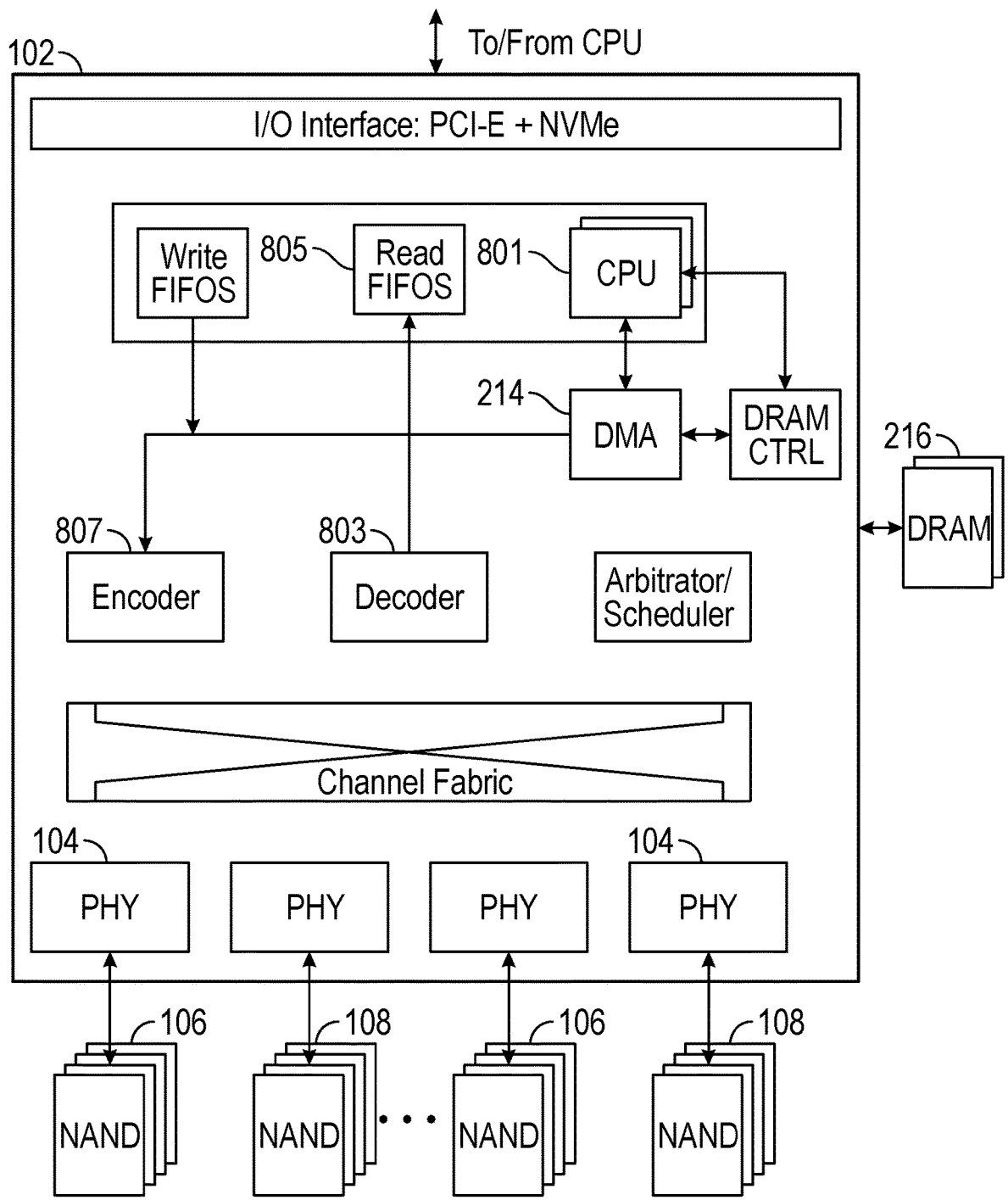
FIG. 8 is a high level block diagram of the flash controller in accordance with some embodiments.

FIG. 8 is a high level block diagram of the flash controller in accordance with some embodiments. The host processor, which can correspond to CPU 156 of FIGS. 1 and 3 in some embodiments, issues commands to the CPU 801 that lives in the non-volatile solid state storage 152 of FIGS. 1 and 3 in some embodiments. Communication between the host processor and the non-volatile solid state storage is done via an Non Volatile Memory express (NVMe) like protocol that runs over a PCIe interface in some embodiments. CPU 801 is then responsible for sending the flash reads and writes to the appropriate flash channels. Data read out of flash is passed through an ECC decode engine 803, and then emptied into a FIFO 805. Once the data is available in this FIFO 805, it is transferred to the host machine by a DMA engine 214 (configured by the CPU 801). Writes from the host machine are of two types in some embodiments: 1) NVRAM writes (that live in a portion of non-volatile solid state storage DRAM inaccessible to the CPU 801), and 2) flash writes. All write data is buffered in DRAM. Flash writes are then sent to the appropriate flash channels by the CPU 801. This data passes through an ECC encode engine 807 before being transmitted into flash. At power-down time, the FPGA logic is responsible for transferring all the NVRAM contents from DRAM 216 to flash 106, 108.

Figure 9:
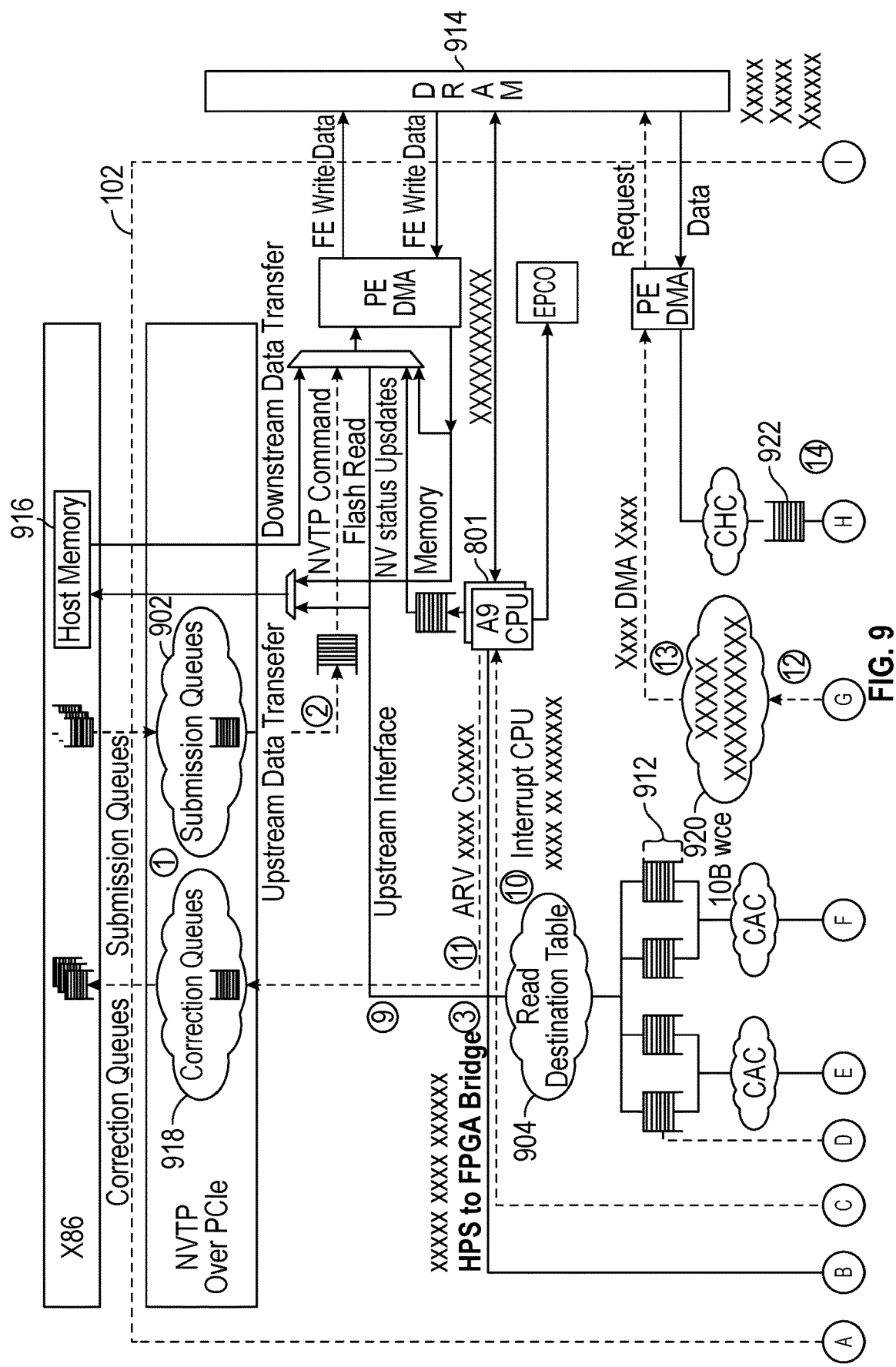
FIG. 9 is a microarchitecture diagram of the flash controller in accordance with some embodiments.
Figure 9:
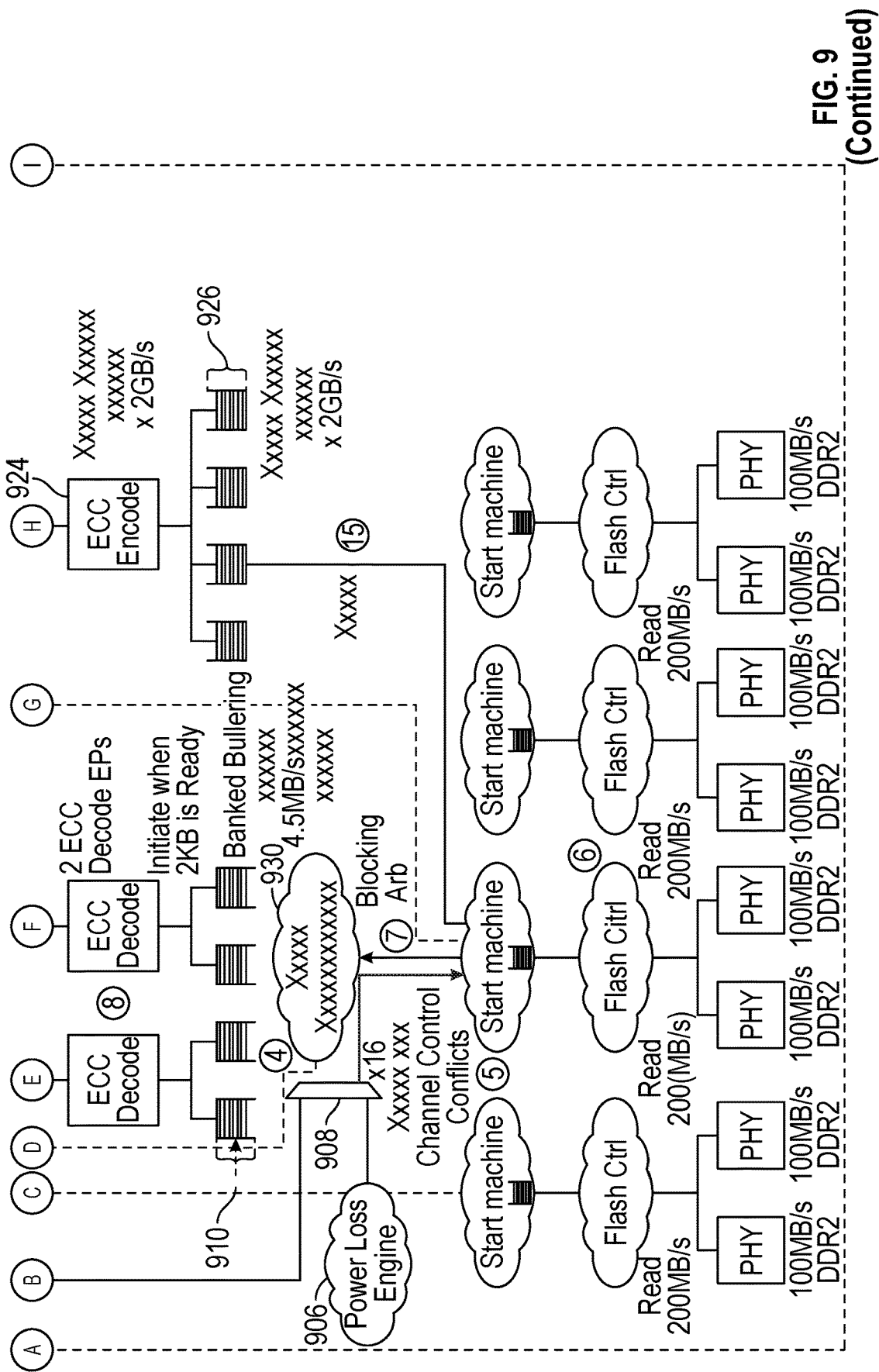

FIG. 9 is a microarchitecture diagram of the flash controller in accordance with some embodiments. The main flows for the reads and writes can be summarized as follows:

Reads

From the flash devices to host DRAM (responses to flash read commands)
From the flash devices to SU DRAM (for partial-processing by the CPU 801/NVRAM recovery)

Writes

From host DRAM to SU DRAM (for NVRAM updates/buffering flash pages before being persisted)
From SU DRAM to flash devices (persisting flash data/saving NVRAM during a power loss)

Read Flows through the microarchitecture diagram are outlined below with the number for each step corresponding to the like circled number in the action flow of FIG. 9. Additional details for the Read Flows may be found with reference to FIGS. 11 and 13A.

1. The host uses a proprietary NVMe-like protocol to signal a new request to the storage unit. This request is written into the submission queue interface 902 exposed by the non-volatile solid state storage, also referred to as a storage unit.
2. The command is written to non-volatile solid state storage DRAM 914, and is then consumed by the CPU 801.
3. Software on the CPU 801 assigns a transaction ID, and builds a scoreboard that tracks the progress of the transaction. Relevant fields tracked through the scoreboard may include transaction ID, addresses, size, etc. This information is also written to the Read Destination Table (RDT) 904, which tells the FPGA where to direct data.
4. Software is responsible for injecting the command into the state machines queues. Every state machine is a slave that can be driven by two masters in some embodiments: the CPU 801, and the power down/loss engine 906. There is a logical mux 908 that selects between the two sources.
5. The state machine, upon receipt of the command, arbitrates for the channel. The state machine is cognizant of plane/bus conflicts on the flash device. Each state machine controls two physical hardware channels, and has a logical view of 16 chip-enables in some embodiments.
6. The state machine issues the read commands to the flash channel. The state machine is also responsible for polling the flash registers to check if data is ready (this mechanism is in lieu of using the ready/busy bit in some embodiments).
7. When data is ready for transfer, the state machine attempts to win arbitration of the upstream bus. Upon winning control of the bus, it starts transferring data from the channel to the staging queues 910 that are located in front of the ECC decode engine. The queues 910 are banked such that eight channels write to one bank in some embodiments. In some embodiments, all transfers will be one page (e.g., 16K) long.
8. When a codeword (e.g., 2K) is ready, the decode process is initiated. There are two ECC decode data paths in some embodiments. After decode, the data goes through cyclical redundancy check (CRC) calculations, and is inserted into another queue 912.
9. The front-end is alerted after the entire transaction is decoded. It then initiates a data transfer to the destination buffer (either non-volatile solid state storage DRAM 914, or the host 916, as programmed into the RDT 904). The front-end alerts the back-end, upon completion of the transfer.
10. The back-end then generates an interrupt to the CPU 801. The CPU 801 reads the state machine registers to glean information about the operation (e.g. number of bits corrected by the decoder, errors, etc.).
11. The CPU 801 cleans up its scoreboard, and signals a completion back to the host 916 via the completion queue 918.

Write Flows through the microarchitecture diagram are outlined below with the number for each step corresponding to the like circled number in the action flow of FIG. 9. Additional details for the Write Flows may be found with reference to FIGS. 12 and 13A.

1. The host uses a proprietary NVMe-like protocol to signal a new request to the storage unit. This request is written into the submission queue interface 902 exposed by the non-volatile solid state storage, also referred to as a storage unit.
2. The command is written to non-volatile solid state storage DRAM 914, and is then consumed by the CPU 801.

3. Software on the CPU 801 assigns a transaction ID, and builds a scoreboard that tracks the progress of the transaction. Relevant fields tracked through the scoreboard may include transaction ID, addresses, size, etc. This information is also written to the Read Destination Table (RDT) 904, which tells the FPGA where to direct data.
4. Software is responsible for injecting the command into the state machines queues. Every state machine is a slave that can be driven by two masters in some embodiments: the CPU 801, and the power down/loss engine 906. There is a logical mux 908 that selects between the two sources.
5. The state machine, upon receipt of the command, arbitrates for the channel. The state machine is cognizant of plane/bus conflicts on the flash device. Each state machine controls two physical hardware channels, and has a logical view of 16 chip-enables in some embodiments.
6. The state machine issues the read commands to the flash channel. The state machine is also responsible for polling the flash registers to check if data is ready (this mechanism is in lieu of using the ready/busy bit in some embodiments).
12. The state machine advertises availability to the downstream arbiter 920, which picks from all pending writes.
13. The downstream arbiter 920 then initiates a direct memory access (DMA) transfer from DRAM 918, which goes through the CRC logic and is written into a staging queue 922 that is located in front of the encoder
14. The ECC encoder 924 operates on the data, and writes it into a staging buffer 926, which is banked (one set of buffers for every 4 channels in some embodiments). This banking sustains throughput to the write channels during the data transfer process at power loss.
15. Data is then transferred to the state machine, where it gets written to the data-register in the flash.
10. The back-end waits for the data to be persisted to flash, and then generates an interrupt to the CPU 801. The CPU 801 reads the state machine registers to glean information about the operation (e.g. errors, etc.).
11. The CPU 801 cleans up its scoreboard, and signals a completion back to the host 916 via the completion queue 918.

Still referring to FIG. 9, the host server communicates with the storage unit via a protocol overlaid on top of PCIe. The host machine contains a submission and completion queue in its memory. The non-volatile solid state storage maintains a corresponding submission queue 902 and completion queue 918 for commands In addition, the FPGA has two DMA engines to move data between the host machine, and the non-volatile solid state storage. Software running on CPU 801 is responsible for coordinating all communication, including the DMA transfers. The non-volatile solid state storage supports two physical PCIe functions in some embodiments. The protocol runs over function-0, while function-1 is used as a "debug" interface to the non-volatile solid state storage. All registers resident in the FPGA can be read by the host over function-1. The main components of the "front-end" of the design are the protocol engine, the DMA engines, and the non volatile (NV) status engine.

The flash controller 102 is the system's gateway to the flash channels. The flash controller 102 maintains queues of commands, which are populated by the CPU 801. The flash controller 102 is responsible for the following:
Sending commands to the flash
Monitoring the state of the flash (since some embodiments do not use the RnB pins)
Arbitration across multiple devices within a channel
Coordinating with upstream and downstream arbiters, and ensuring the transfer of data between the flash controller, and the FPGA logic Flash controller 102 exposes a bank of 8 commands to the CPU 801 in some embodiments. These are registers that the CPU 801 can read and write via an AXI interface in some embodiments. Software running on the CPU 801 is responsible for managing these queues, and writing commands to them. The state machine maps these commands to "micro-instructions" (uops) that it then issues to a flash sequencer. In some embodiments, each flash state machine coordinates two physical flash channels.

In the case of reads, the state machine is responsible for securing the upstream bus via a req-gnt-ack handshake with the upstream arbiter. Once the bus is secured, it proceeds to read out data from the register in the flash device. One implementation of the state machine will always read out a whole page (16 K) worth of data from the flash register in some embodiments. It should be appreciated that other implementations will have the ability to read selective codewords (e.g., 2 K blocks) from the flash register.

In the case of writes, the state machine first initiates a DMA of data from DRAM, which in turn feeds an LDPC encode engine. Once data is available (post-encode), the downstream arbiter drives an ack back to the requestor channel. The channel then sends a write command to the flash, and establishes a conduit for data to flow from the staging FIFOs that maintain encoded data to the cache register in flash. Writes can complete once they are successfully persisted to flash. In one embodiment. the flash devices run at 100 MHz (DDR), giving us a peak bandwidth of 200 MB/s, per-flash channel.

In some embodiments, the flash controller state machine may not implement all the possible flash commands. For example, in one embodiment, commands that will be implemented are reads (hard and soft decision), writes, and erases. All other commands (such as reset, initialization sequences, setting features etc.) may be directly communicated to the sequencer by software running on the CPU 801. This mode of operation may be referred to as the "bypass" path. Software activates this path by writing to a dedicated bypass register in one embodiment. The flash command and sequencer register address are encoded in the command packet written to this register. The state machine then communicates the same command to the sequencer via an open core protocol in some embodiments. Data read out of the flash or the sequencer are stored in another dedicated bypass register that can be read by software running on the CPU 801. When a command has successfully been sent to the sequencer, hardware sets a completion bit in this aforementioned register, and then allows for the next bypass command to be enqueued.

As described earlier, the state machine has a bank of 8 registers that maintain outstanding flash transactions to the channels. These entries are managed by software running on the ARM, and are mapped as registers visible on the CPUs AXI bus in some embodiments. Commands issued to the flash channels can complete out of order; it is software's responsibility to poll their completion status. Software running on the CPU 801 will maintain a scheduler that keeps track of the command-queue state in each of the flash channels. Upon receipt of a new command from the host processor, the CPU 801 will perform a conflict check to ensure that there are no pending requests to the flash controller 102 that use the same flash plane (note that there are 1024 blocks per plane, and 512 16K pages per block). This implies that software needs to do a compare on bits [32:14] of the incoming physical address against all other pending transactions. It is software's responsibility to ensure that there is a maximum of one request issued to a flash plane, at any given point of time in some embodiments.

Figure 10:
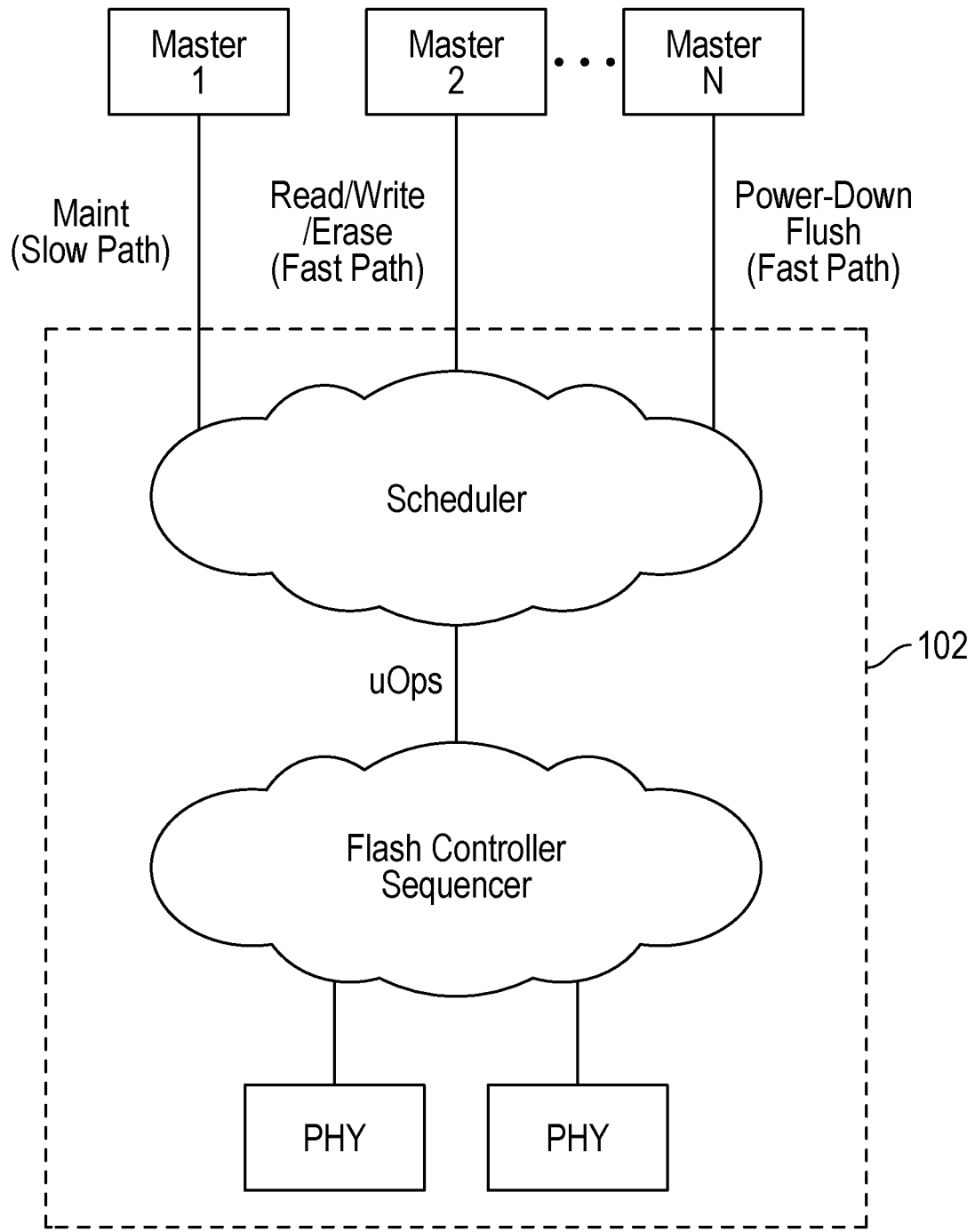
FIG. 10 is a high level overview of the flash controller handling operation requests from multiple masters in accordance with some embodiments.

FIG. 10 is a high level overview of the flash controller handling operation requests from multiple masters in accordance with some embodiments. The embodiments described herein provide for a scheduler state-machine that connects to a flash controller which in turn talks to multiple flash channels. Commands are programmed into this state-machine by upper-level stacks in some embodiments. The state machine can support multiple masters. As one example, three masters are provided. The three masters cover a slow maintenance path used to setup flash state, a fast hardware-accelerated path that performs latency-critical operations such as reads, writes, and erases, and a fast power-down flush path which is responsible for transferring contents of an NVRAM device to flash in the event of a power-loss. It should be appreciated that the masters may be embodied as software running on a CPU or hardware, and the term masters refers to who is driving the operations. The state-machine is responsible for arbitrating between transactions that appear on these paths and enforcing correct quality of service (QoS). Operations on the fast path are split into multiple phases in order to extract maximum performance and efficiency form the flash. Reads are split up into three phases in some embodiments. The three phases include a command phase, a poll phase that checks if the flash is ready, and finally a read out phase to transfer data. Writes are may be split into two phases in some embodiments. The two phases include a command phase, and a poll phase that checks for completion. The state-machine is responsible for splitting up these operation requests into phases, forming a sequence from the phases, keeping track of their progress across the different flash devices, and optimally scheduling the phases, sequence of phases, and/or operation requests without incurring conflicts. In addition, data transfer operations may need to arbitrate for other system resources (channels, buffers, DMA engines etc.), which is the responsibility of the state-machines. In some embodiments, there may be a need for operation of different flash chips in different modes (SLC/MLC/TLC, etc.). The scheduler can keep track of these modes, and enforce the correct signaling in accordance with the mode the flash is in. The different phases that the operation requests may be segmented/broken down/partitioned into to form a sequence is further illustrated with reference to FIGS. 11 and 12.

Multi-master arbitration is also provided by the embodiments. One example of a situation that uses multi-master arbitration is the implementation of the read recovery logic. In the case of read failure, the system can sometimes try and recover data by changing the voltage thresholds of the flash devices. The state machine scheduler allows these maintenance operations to run concurrently with the regular fast path operations, by arbitrating between the different operations at transactional boundaries. As noted above, the master refers to the driver of the operation and may be embodied as hardware or software executing on a processor such as CPU801. A master may also be referred to as an agent in some embodiments.

Traditional drives typically use a combination of firmware running on a controller that outputs microcode in a format that can be consumed by the flash sequencer. All requests flow through the controller, and the controller is responsible for arbitrating between different requestors, and ensuring that commands are fully formed before being sent to the sequencer. The embodiments described herein push this boundary into the hardware in order to maximize performance, and minimize firmware's involvement. The embodiments allow for multiple masters or agents to directly access the flash sequencer via the scheduler (state machine). The scheduler takes care of buffering commands received from different masters, arbitrating between them, and pushing them to the sequencer when fully formed. This allows the mechanism to minimize the number of hops that need to be made through the controller in system configurations where there are multiple masters/agents (requestors) talking to the same flash sequencer. It should be appreciated that in addition to the "multiple master" portion, the embodiments also enable for the flash operations to be chunked into different states or phases and scheduled for maximal efficiency by the hardware (and not firmware).

Figure 11:
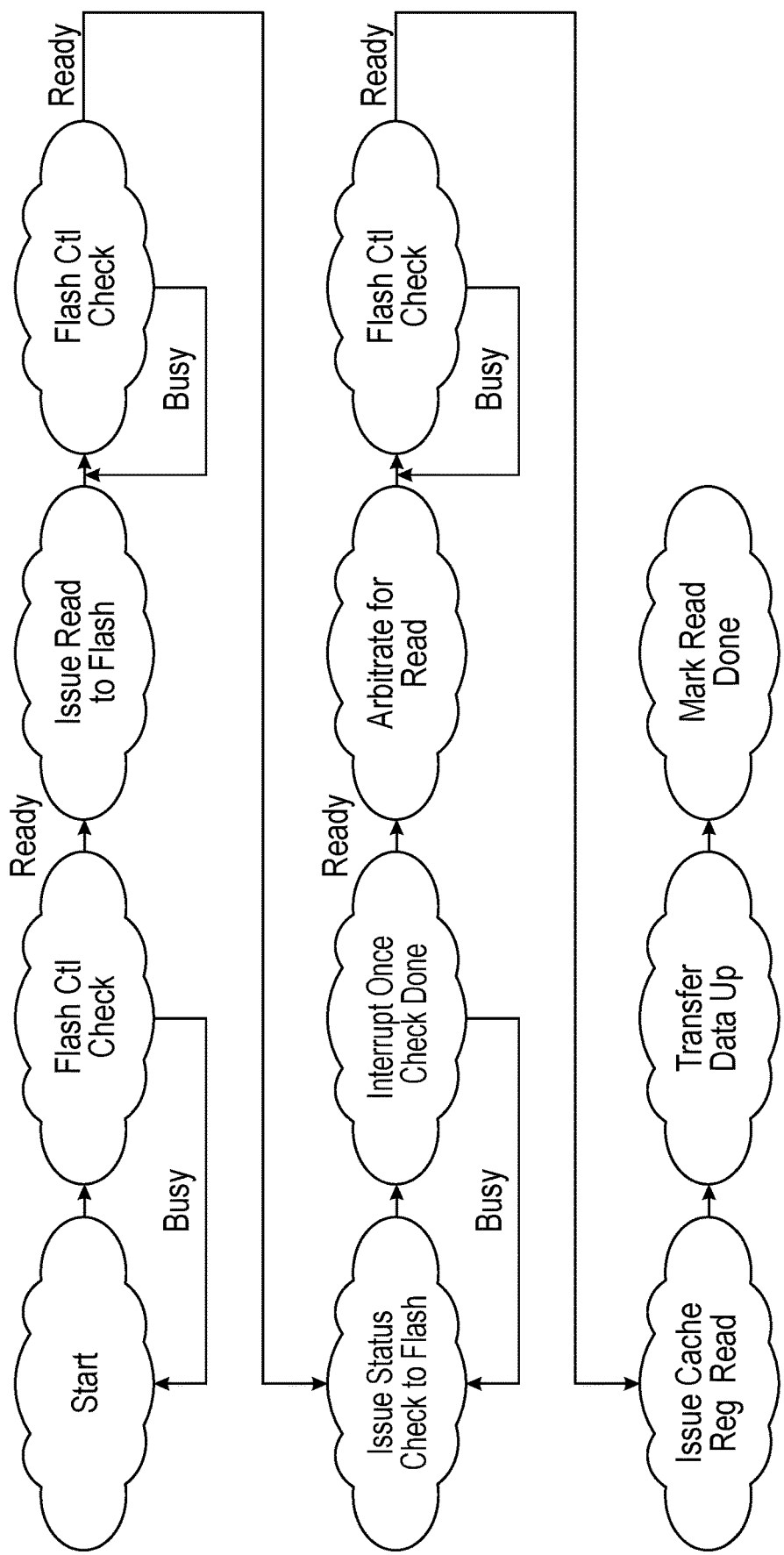
FIG. 11 is an action diagram illustrating the read flow for the flash controller state machine in accordance with some embodiments.
Figure 12:
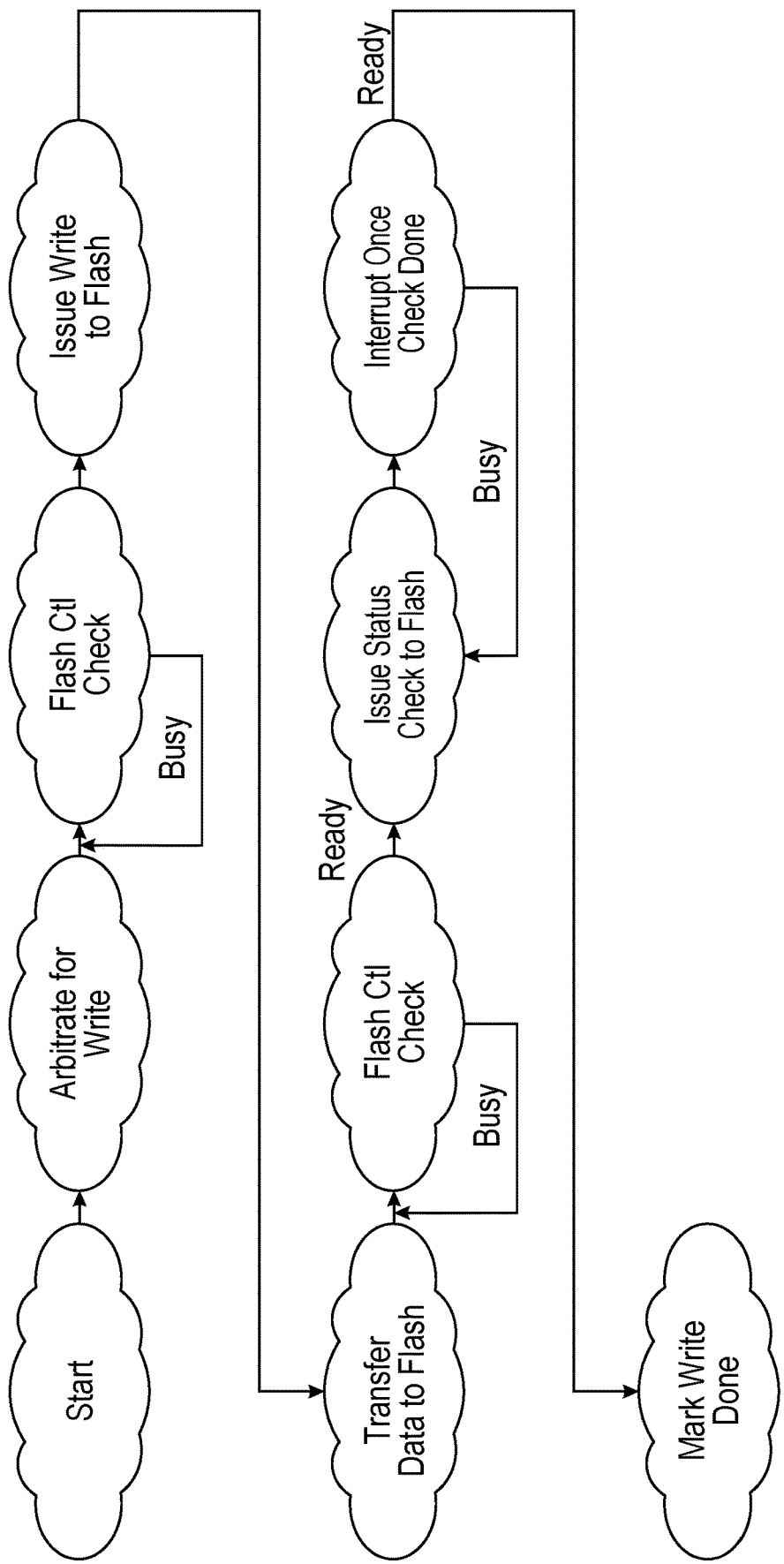
FIG. 12 is an action diagram illustrating the write flow for the flash controller state machine in accordance with some embodiments.

FIG. 11 is an action diagram illustrating the read flow for the flash controller state machine in accordance with some embodiments. The state machine is responsible for sequencing commands out to the flash devices, and also for querying their state. When "status check" commands return from the flash devices, they raise an interrupt, and alert the state machine. The state machine is responsible for reading out the status of the interrupt register in the flash controller, and clearing it, as required. The state machine maintains a timer to track these "polling" intervals. The state machine may just maintain one global polling timer, or timers for every entry of the command queue in some embodiments. Before sending any commands to the flash controller, the state machine queries the status of the controller itself. If the controller is busy, the state machine will have to backoff, and reissue. The main steps in performing a read are as follows:

Issue the read command to the flash device
Issue a status check command to the flash device
Once the flash device is ready, arbitrate for control of the upstream FIFO write port
After winning arbitration, issue a read-from-cache-register command to the flash device
Once the transfer of data completes, relinquish control of the upstream FIFO write port FIG. 12 is an action diagram illustrating the write flow for the flash controller state machine in accordance with some embodiments. The main steps in performing a write are as follows:

Arbitrate for control of the downstream FIFO read port
After winning arbitration, issue a write command to the flash device
Once the transfer of data completes, relinquish control of the downstream FIFO read port
Issue a status check command to the flash device
Once the flash device is done, mark the write as having been persisted From the non-volatile solid state storage unit 152 point of view, reads complete when data gets decoded, and are sent back to the host processor. Writes and erases complete once data has been persisted/erased, respectively. Completions are indicated to software running on the CPU 801 by a bank of registers that live in the back end of the design. The back-end sets completions for writes and erases. The front-end DMA engine passes a transaction ID to the back-end to set the completion for read transactions. The back-end design maintains 4 64-bit registers, in one embodiment, that indicate the completion status for all issued transactions. When a read, write, or erase completes, the hardware will decode its transaction ID, and set a bit in the relevant position in one of the completion registers. The first register latches completions for transaction IDs 0-63, the second for IDs 64-127, and so on. When a completion register transitions from 0→1, hardware will raise an interrupt. This interrupt stays high as long as the completion register is non-zero. Software is responsible for reading out the contents of the completion register, and writing a mask value back to this register. Hardware will perform a bit-wise AND of this mask provided by software with the existing value in the register. This ensures that any completions registered in the time window between software reading and writing the register, do not get dropped.

Figure 13A:
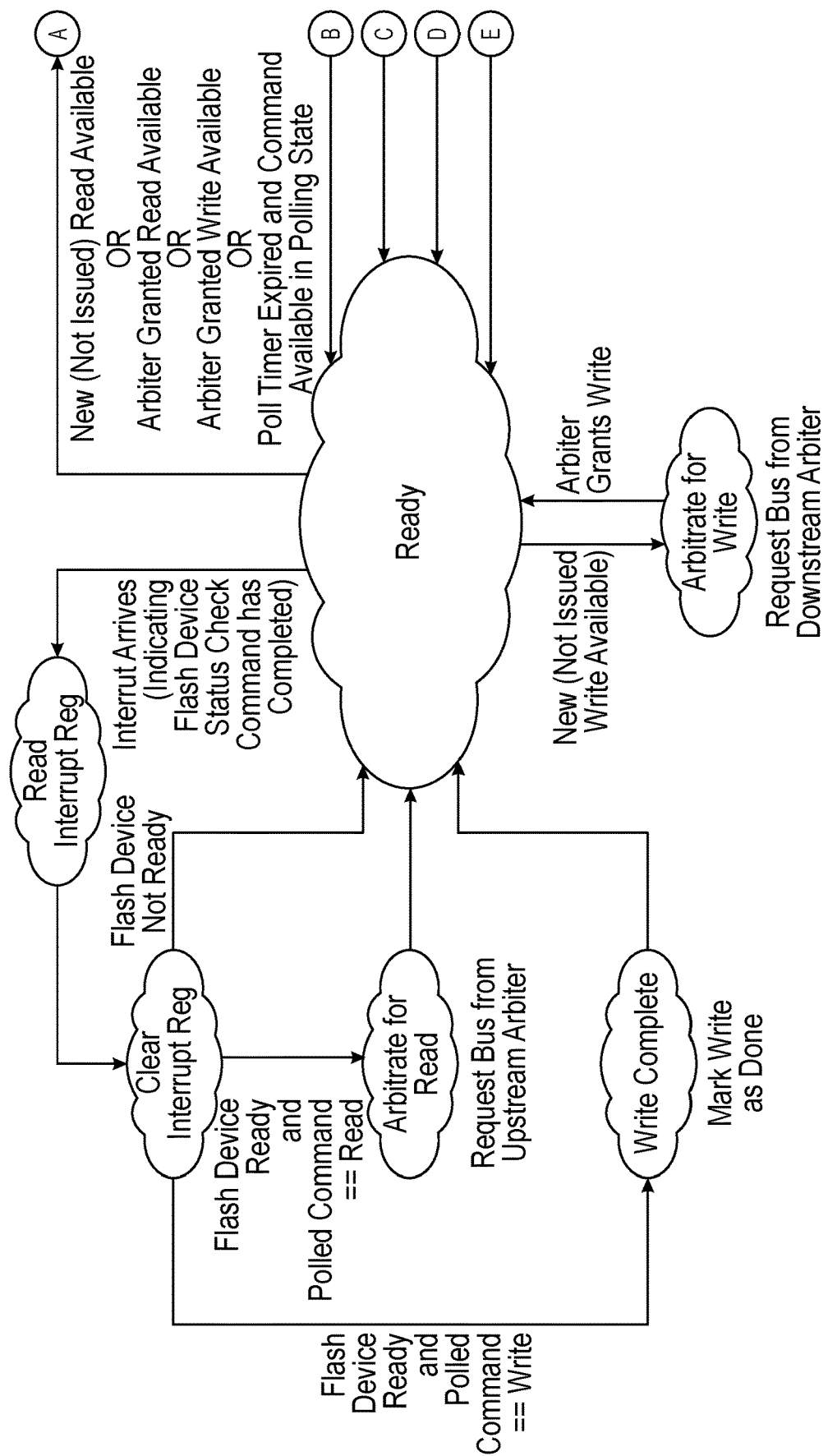
FIG. 13A illustrates a flash controller state machine transition diagram in accordance with some embodiments.
Figure 13A:
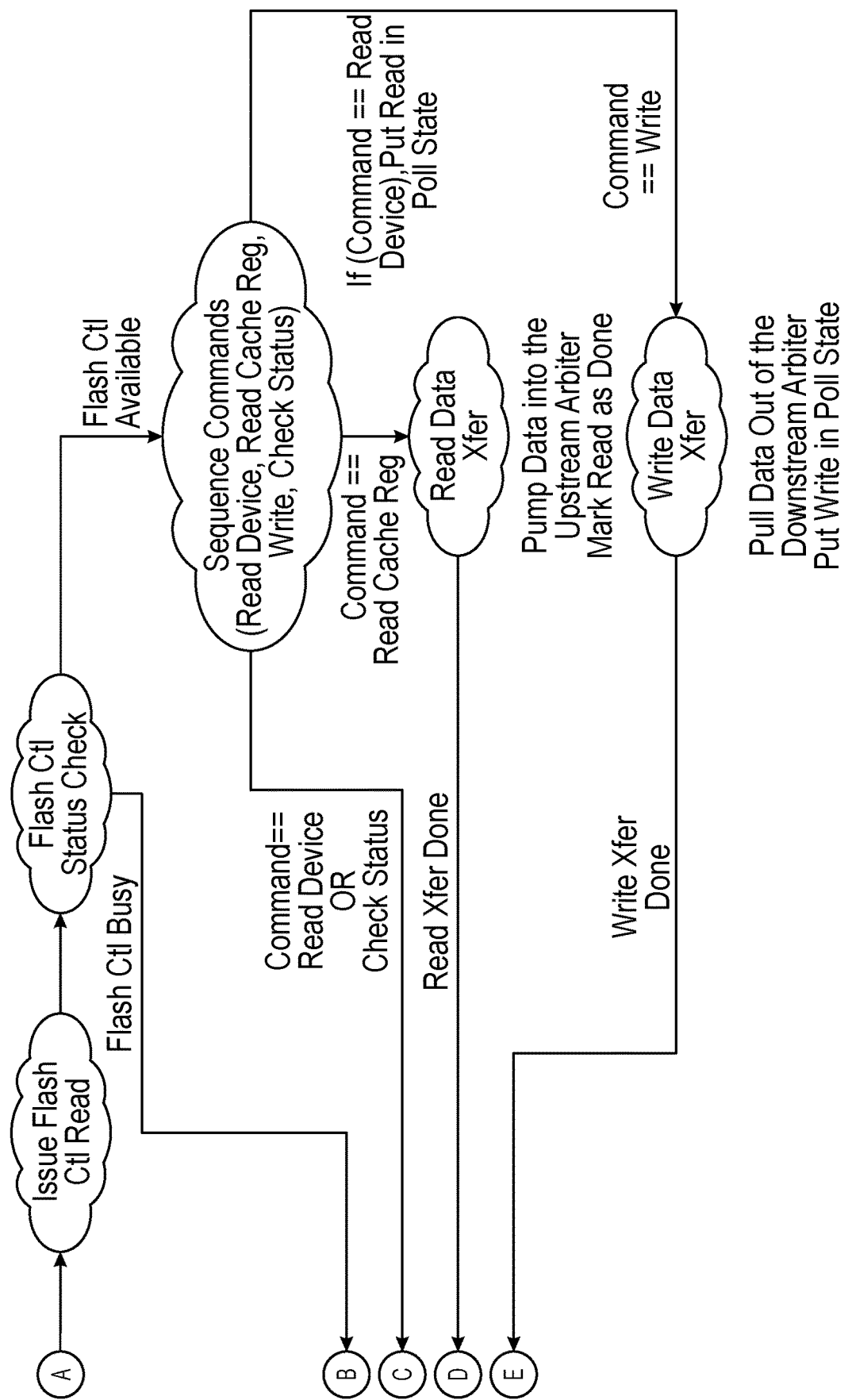

FIG. 13A illustrates a flash controller state machine transition diagram in accordance with some embodiments. The NVRAM region in DRAM is sized for a maximum of 2 GB in some embodiments. It should be appreciated that the exact size is configurable by software. The NVRAM flush process stripes this memory evenly across 32 channels, implying that every flash channel needs to write four to eight 8 MB blocks of data. Every state machine thus receives a maximum of 16 block-writes, which are then splits across the two flash channels it manages in some embodiments. Since each state machine has eight slots, the NVRAM dump will be performed on 128 flash blocks (16*8) at a time, with DRAM data being uniformly distributed. That is, the hardware will first dump 1 GB across 128 flash blocks, and then transition over to dumping the second GB across the next set of 128 flash blocks. If the NVRAM section is sized between 1 and 2 GB (e.g., 1.5 GB), then the second set of 128 flash blocks will be partially populated. Software has control over the number of DRAM pages in each set of flash blocks that get written to during the dump (refer to the NVRAM configuration register format).

There are n (e.g., 4) different NVRAM regions in flash that can be used to hold data on a power-loss event in some embodiments. At boot-up time, software will choose one of these regions, and configure the storage unit with the address map of the appropriate NVRAM region. The address map of each NVRAM region requires 256 (number of flash blocks)*5 Bytes (of address) worth of storage. During the initialization process, software is responsible for choosing an NVRAM region, and configuring the flush engines appropriately. The flush engines themselves are distributed, with one engine associated with each state machine. Each flush engine has a map that stores 16 destination (flash) block addresses, and 1 source (DRAM) address. The flush engine uses this programmed source DRAM base address, and keeps incrementing it by 32*16 K (512 K) to get subsequent DRAM source addresses that are bound to the same state machine. Each state machine only has 8 slots, and uses the first 8 destination flash block addresses to dump the first GB, and the second 8 destination addresses to dump the second GB in some embodiments. It should be appreciated that all the 8 flash blocks used in each stage of the NVRAM dump sequence use separate chip-enables in some embodiments. That is, blocks 0-7 are on 8 distinct chip-enables, as should blocks 8-15.

Referring back to FIG. 9, there is a single DMA engine that feeds the encoder in some embodiments. The encoder output in turn gets split across eight FIFO's. Each FIFO talks to two state machines (and hence four channels). Thus, the maximum throughput to the flash channels in this embodiment is 200 MB/s*8=1.6 GB/s. In order to maximize this throughput, adjacent (16 K) DRAM pages are first striped across the different FIFO's, then across the different flash channels serviced by a FIFO, and finally across different flash blocks within a flash channel. This allows the ability to get maximum row-buffer parallelism from the DRAM, and also get maximum write throughput across the flash channels. In this way, every $8^{th}$ DRAM page goes to the same FIFO, every $16^{th}$ page to the same flash state machine, every $32^{nd}$ page goes to the same flash channel, and every $128^{th}$ DRAM page gets written to the same flash block. The state machine may be programmed with the 8 flash block addresses, and the first DRAM source address accessed by that state machine.

As part of initialization, software may be responsible for "arming" the NVRAM dump sequence by first programming the source and destination addresses across all the flash state machines, and then finally writing to the NVRAM control configuration register. Both the FPGA logic and the HPS are notified during a power-loss event. If the NVRAM dump process has been armed, the backend logic will first wait for the front-end NV-status engine to push all its contents into DRAM. Additionally, the backend state machines will wait for all the state machines to quiesce before beginning the NVRAM flush process. This quiescence prevents multiple requests from simultaneously accessing the same flash planes. Once all aforementioned conditions are met, the flush engines start kicking out requests to the state machines.

Data being returned from the flash devices is passed through a LDPC decoder before it can be consumed. The FPGA has two decoders for bandwidth reasons in some embodiments. In order to fully saturate the decoders, the channels are statically partitioned to talk to one of the decoders (16 channels per decoder). Additionally, since the LDPC decoder bandwidth exceeds channel bandwidth, each LDPC decoder will have the ability to read from two different queues. This implies that 8 channels need to arbitrate to win the write-port into their assigned FIFO. This arbitration is done by the upstream arbiter 930. There are four arbiters in the design in some embodiments, one for every group of 8 channels. The state machines send their requests to the arbiter once data is ready in the cache register (note that there is no data buffering available in the state machines themselves). The arbiter performs an age-ordered pick, and sends a grant back to one of the requesting channels in some embodiments. Once granted, the state machine is allowed to send data out of flash into the FIFO, and cannot be interrupted until it is done with its entire data transfer (this behavior may change in other embodiments). Once the data transfer is complete, the state machine relinquishes its hold of the FIFO write port, allowing the arbiter to grant another outstanding requestor. The backend RTL is responsible for sending a packet header to the decoder (along with the start of packet (SOP)). The decoder bounces this packet header back with the data output, and adds two fields that indicate CRC pass/fail, and decoder pass/fail status.

As indicated in FIG. 9, there are FIFO's that latch data that is output by the decoder. The DMA engine that resides in the front-end is responsible for reading out data from these FIFOs and transferring the data to the host server. In order to facilitate this, there is logic that keeps track of which code-word is being decoded (within a page), and generates a "completion packet" when the last code-word has been decoded. These completion packets are enqueued in a completion FIFO which is exposed to the front-end DMA controller.

The front-end DMA engine controller is alerted whenever there is a valid completion packet in the FIFO. The front-end DMA engine then performs the following actions:

1. Read out the head of the completion queue 918 to get the completion packet. This completion packet will provide information about the transaction ID, and an identifier to the FIFO that contains the user data.
2. When ready, send a read signal to the data FIFO to read out the user data. The front-end DMA engine will be responsible for maintaining a counter to make sure it dequeues the correct number of data bytes from the FIFO.
3. Finally, the front-end is responsible for sending back the read's transaction ID to the back-end, after the DMA to the host completes. The back-end is responsible for registering this completion in the afore-mentioned completion vector, and raise an interrupt appropriately.

It should be appreciated that the read data from the completion FIFOs and the data FIFOs will be available one cycle after the read is asserted. Also, consecutive reads to the completion FIFO are at least four cycles apart (to allow for delays due to asynchronous crossings) in some embodiments. The front-end is expected to stop sending new read-transfer TID's (to signal completion for reads) when it sees the be_fe_rdXferFifoFull signal to be high.

Data being written to the flash devices is passed through a low density parity check (LDPC) encoder before it can be persisted in some embodiments. The FPGA has one "fixed-code" encoder which has a bandwidth of 2 GB/s in some embodiments. Since there is a significant bandwidth mismatch between the encoder and the flash channels, there will be 8 FIFOs (each 32 KB deep) that will buffer data that is to be written to flash. Each FIFO will service 4 channels (2 state machines). The encoder has one datapath, and thus requires only one DMA engine to transfer data from DRAM to the input FIFO of the encoder in this embodiment. The bandwidth of the DMA transfer is expected to be about 3 GB/s, in one embodiment, so one DMA engine is enough to fully saturate the encoder.

The arbitration of the downstream FIFO read paths, and initiation of the DMA transfers, is done by the downstream arbiter 920. This block functions as a hierarchical arbiter—it contains—"channel arbiters" that arbitrate for the FIFO read access across four channels, and another "DMA arbiter" that arbitrates for the DMA engine access across the eight channel arbiters. The 16 state machines send their write requests to the downstream arbiter, which then farms them out to the assigned channel arbiters. The channel arbiter performs an age-ordered pick across two input state machine requests, and then assigns a winner, which in turn gets sent to the DMA arbiter in some embodiments. The DMA arbiter picks across the eight winners from the channel arbiters, performs a DMA access, and then sends an acknowledgment back to the channel arbiters. Once the LDPC encode completes, the encoder notifies the channel arbiter, which can then proceed to finally send an acknowledgment to the requesting state machine. After this, the state machine can pull data out of the FIFO, and transfer to the cache register. Once data is written to the cache register, the state machine relinquishes control of the FIFO-read port, allowing the channel arbiter to grant the next request. Refer to FIG. 8 for a graphical illustration of this path. The backend RTL is responsible for sending a packet header to the encoder (along with the SOP). The encoder bounces this packet header back with the data output, and adds a field that indicates CRC pass/fail status.

Figure 13B:
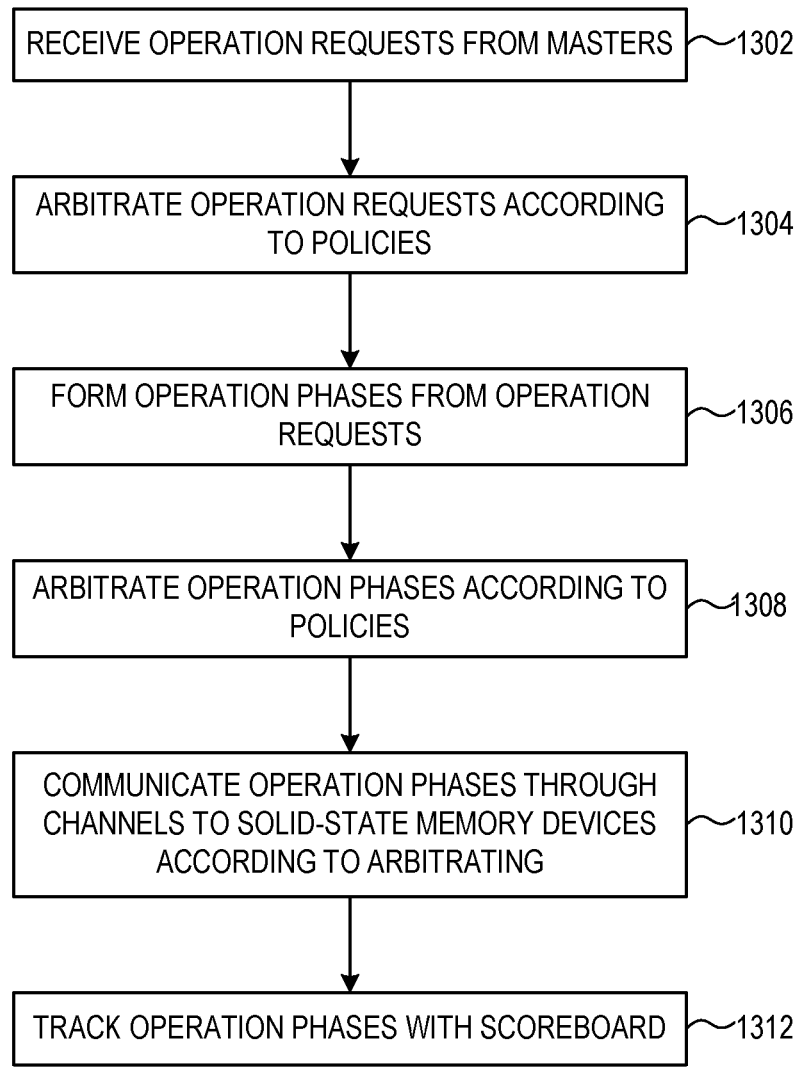
FIG. 13B is a flow diagram of a method for scheduling in a memory controller.

FIG. 13B is a flow diagram of a method for scheduling in a memory controller. The method can be practiced by various embodiments of memory controllers described herein, such as a controller of a storage unit, or the flash controller. In an action 1302, operation requests are received from masters. In an action 1304, the operation requests are arbitrated, according to policies. These policies are configurable in some embodiments. In an action 1306, operation phases are formed from the operation requests. The operation phases may be formed as described above with reference to FIGS. 9-13A. In an action 1308, the operation phases are arbitrated according to the policies. The operation phases may be arbitrated as described above with reference to FIGS. 9-13A and utilize any know arbitration mechanism. The operation phases are communicated through channels to solid-state memory devices according to the arbitrating, in an action 1310. The operation phases are tracked with a scoreboard, in an action 1312 in some embodiments.

Figure 14:
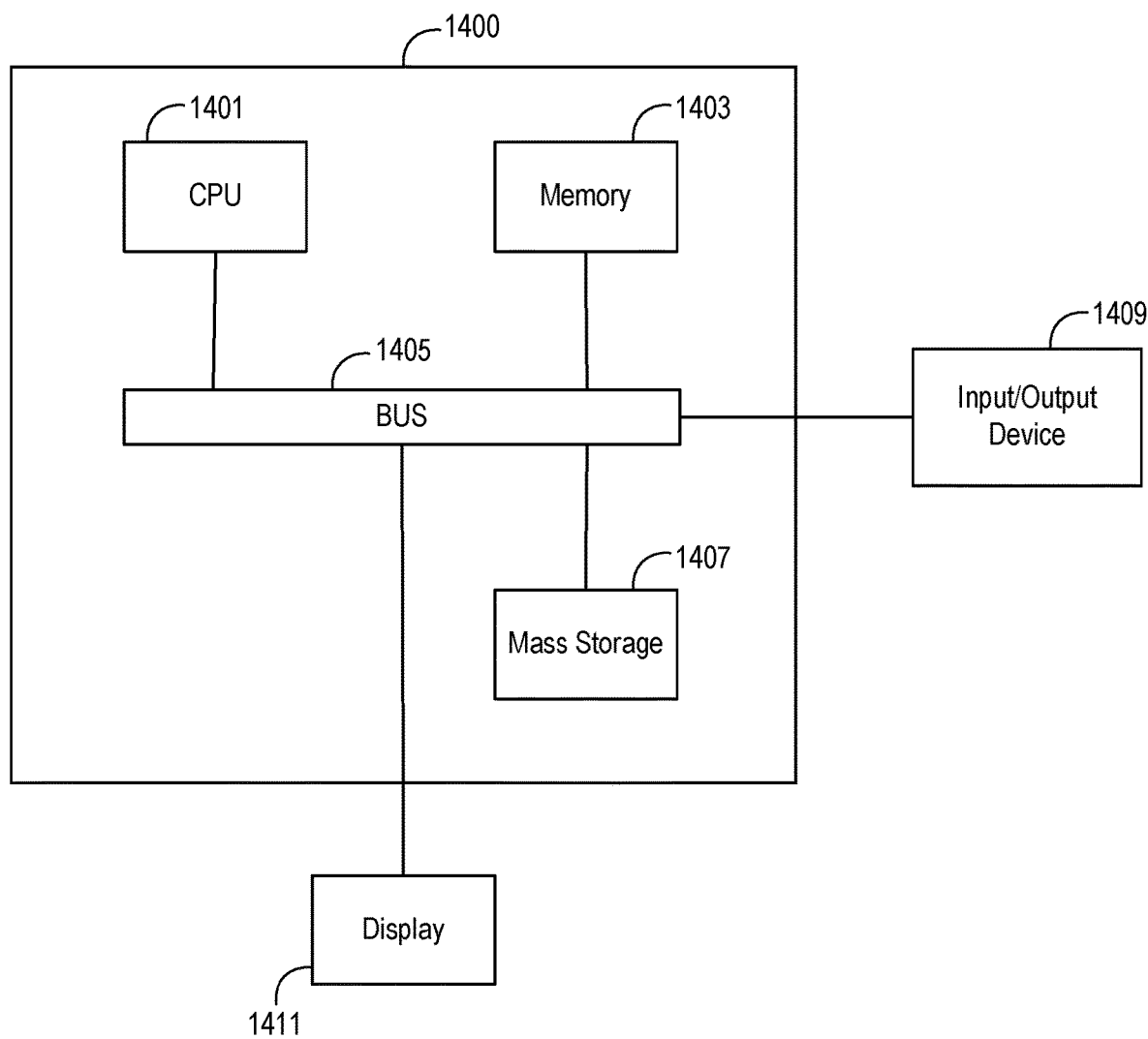
FIG. 14 is an illustration showing an exemplary computing device which may implement the embodiments described herein.

It should be appreciated that the methods described herein may be performed with a digital processing system, such as a conventional, general-purpose computer system. Special purpose computers, which are designed or programmed to perform only one function may be used in the alternative. FIG. 14 is an illustration showing an exemplary computing device which may implement the embodiments described herein. The computing device 1400 of FIG. 14 may be used to perform embodiments of the functionality for an external processor (i.e., external to the flash controller), CPU 801 (internal to the flash controller) or the multithreaded/virtualized microcode sequence engine (internal to the flash controller) in accordance with some embodiments. The computing device 1400 includes a central processing unit (CPU) 1401, which is coupled through a bus 1405 to a memory 1403, and mass storage device 1407. Mass storage device 1407 represents a persistent data storage device such as a disc drive, which may be local or remote in some embodiments. The mass storage device 1407 could implement a backup storage, in some embodiments. Memory 1403 may include read only memory, random access memory, etc. Applications resident on the computing device may be stored on or accessed via a computer readable medium such as memory 1403 or mass storage device 1407 in some embodiments. Applications may also be in the form of modulated electronic signals modulated accessed via a network modem or other network interface of the computing device. It should be appreciated that CPU 1401 may be embodied in a general-purpose processor, a special purpose processor, or a specially programmed logic device in some embodiments.

Display 1411 is in communication with CPU 1401, memory 1403, and mass storage device 1407, through bus 1405. Display 1411 is configured to display any visualization tools or reports associated with the system described herein. Input/output device 1409 is coupled to bus 1405 in order to communicate information in command selections to CPU 1401. It should be appreciated that data to and from external devices may be communicated through the input/output device 1409. CPU 1401 can be defined to execute the functionality described herein to enable the functionality described with reference to FIGS. 1-13B. The code embodying this functionality may be stored within memory 1403 or mass storage device 1407 for execution by a processor such as CPU 1401 in some embodiments. The operating system on the computing device may be MS-WINDOWS™, UNIX™ LINUX™, iOS™, CentOS™, Android™, Redhat Linux™, z/OS™, or other known operating systems. It should be appreciated that the embodiments described herein may also be integrated with a virtualized computing system implemented with physical computing resources.

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

With the above embodiments in mind, it should be understood that the embodiments might employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing. Any of the operations described herein that form part of the embodiments are useful machine operations. The embodiments also relate to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

A module, an application, a layer, an agent or other method-operable entity could be implemented as hardware, firmware, or a processor executing software, or combinations thereof. It should be appreciated that, where a software-based embodiment is disclosed herein, the software can be embodied in a physical machine such as a controller. For example, a controller could include a first module and a second module. A controller could be configured to perform various actions, e.g., of a method, an application, a layer or an agent.

The embodiments can also be embodied as computer readable code on a tangible non-transitory computer readable medium. The computer readable medium is any data storage device that can store data, which can be thereafter read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion. Embodiments described herein may be practiced with various computer system configurations including hand-held devices, tablets, microprocessor systems, microprocessor-based or programmable consumer electronics, minicomputers, mainframe computers and the like. The embodiments can also be practiced in distributed computing environments where tasks are performed by remote processing devices that are linked through a wire-based or wireless network.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

In various embodiments, one or more portions of the methods and mechanisms described herein may form part of a cloud-computing environment. In such embodiments, resources may be provided over the Internet as services according to one or more various models. Such models may include Infrastructure as a Service (IaaS), Platform as a Service (PaaS), and Software as a Service (SaaS). In IaaS, computer infrastructure is delivered as a service. In such a case, the computing equipment is generally owned and operated by the service provider. In the PaaS model, software tools and underlying equipment used by developers to develop software solutions may be provided as a service and hosted by the service provider. SaaS typically includes a service provider licensing software as a service on demand. The service provider may host the software, or may deploy the software to a customer for a given period of time. Numerous combinations of the above models are possible and are contemplated.

Various units, circuits, or other components may be described or claimed as "configured to" perform a task or tasks. In such contexts, the phrase "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A scheduling system, comprising:
a scheduler configurable to receive a plurality of operation requests from a plurality of masters that comprise a maintenance path configured to adjust voltage thresholds for read recovery operations, a hardware-accelerated path that performs operations including reads, writes and erases, and a power-down flush path for transferring contents of a first memory to storage memory in event of power-loss, wherein the plurality of masters includes a first master associated with the hardware-accelerated path having a faster path with higher priority in arbitration and a second master associated with the maintenance path having a slower path with lower priority in arbitration;
the scheduler configurable to form a sequence of one or more phases from each of the operation requests;
the scheduler configurable to arbitrate the plurality of operation requests and the one or more phases through one or more policies based on whether each of the operation requests is received from the first master or the second master of the plurality of masters; and
a sequencer configurable to receive the one or more phases and communicate with at least two flash memory devices through a plurality of channels, the at least two flash memory devices coupled to the sequencer, the at least two flash memory devices have differing types of flash memory device interfaces associated with differing protocols for receiving commands from the sequencer.

2. The scheduling system of claim 1, wherein:
the differing protocols include single data rate and double data rate protocols.

3. The scheduling system of claim 1, further comprising:
the scheduler configured to receive the one or more policies.

4. The scheduling system of claim 1, further comprising:
the sequencer having a scoreboard to track status of each of the one or more phases.

5. The scheduling system of claim 1, wherein the scheduler configurable to arbitrate the plurality of operation requests and the one or more phases comprises:
the scheduler configurable to split the write operation into a command phase and a poll phase for the write operation, split a read operation into the command phase, the poll phase and a readout phase for the read operation, split an erase operation into the command phase and the poll phase for the erase operation, form a sequence from such phases, track progress of such phases across differing flash devices, and schedule such phases, sequences of phases and operation requests without incurring conflicts.

6. The scheduling system of claim 1, wherein the scheduler configurable to receive and arbitrate the plurality of operation requests from the plurality of masters comprises:
the scheduler configurable for receiving and arbitrating a first operation request from a first master performing read recovery, and issuing a first plurality of phases for varying a voltage threshold of a first one of the at least two flash memory devices through a first one of the plurality of channels concurrent with receiving and arbitrating a second operation request from a second master, and issuing a second plurality of phases for communicating with a second one of the at least two flash memory devices through a second one of the plurality of channels.

7. A scheduler, comprising:
a scheduler configurable to couple to a plurality of masters that comprise a maintenance path configured to adjust voltage thresholds for read recovery operations, a hardware-accelerated path that performs operations including reads, writes and erases, and a power-down flush path for transferring contents of a first memory to storage memory in event of power-loss, and receive a plurality of operation requests from the plurality of masters, wherein a first master of the plurality of masters is associated with the hardware-accelerated path and a second master of the plurality of masters is associated with the maintenance path;
the scheduler configurable to form a plurality of flash memory device independent phases from the plurality of operation requests;
an arbiter configurable to arbitrate the plurality of operation requests and the plurality of phases in accordance with one or more policies, the one or more policies includes the arbiter according higher priority to operation requests from the first master associated with the hardware-accelerated path having a faster path than to operation requests from a second master associated with the maintenance path having a slower path; and
a sequencer configurable to receive the plurality of phases from the scheduler and arrange signaling to communicate with two or more flash memory devices through two or more channels regarding the plurality of phases, the at two or more flash memory devices coupled to the sequencer, the at two or more flash memory devices have differing types of flash memory device interfaces associated with differing protocols for receiving commands from the sequencer.

8. The scheduler of claim 7, further comprising:
the sequencer and the two or more flash memory devices having differing types of flash memory device interfaces associated with differing protocols wherein the differing protocols include single data rate and double data rate protocols.

9. The scheduler of claim 7, further comprising:
the arbiter configurable to have the one or more policies configurable for optimization of latency, bandwidth or quality of service.

10. The scheduler of claim 7, further comprising:
the sequencer configurable to track the plurality of phases with a scoreboard.

11. The scheduler of claim 7, wherein the scheduler is configurable to split out the command phase for each of the write operation, the read operation and the erase operation, split out the poll phase for each of the write operation, the read operation and the erase operation, and split out the readout phase for the read operation.

12. A method, comprising:
    forming a plurality of operation phases from a plurality of operation requests from a plurality of masters that comprise a maintenance path configured to adjust voltage thresholds for read recovery operations, a hardware-accelerated path that performs operations including reads, writes and erases, and a power-down flush path for transferring contents of a first memory to storage memory in event of power-loss, wherein a first master of the plurality of masters is associated with the hardware-accelerated path and a second master of the plurality of masters is associated with the maintenance path;
    arbitrating the plurality of operation requests and the plurality of operation phases according to one or more policies, including arbitrating the plurality of operation requests and the plurality of operation phases with higher priority for the first master associated with the hardware-accelerated path having a faster path and with lower priority for the second master associated with the maintenance path having a slower path;
    communicating the plurality of operation phases through separate channels to two or more solid state memory devices in accordance with the arbitrating; and
    generating different signals for at least two different types of solid state memory devices, wherein the at least two different types of flash memory devices are coupled to a sequencer, the at least two different types of flash memory devices have differing types of flash memory device interfaces associated with differing protocols for receiving commands from the sequencer.

13. The method of claim 12, wherein the two or more solid state memory devices have differing types of solid state memory device interfaces associated with differing protocols wherein the differing protocols include single data rate and double data rate protocols.

14. The method of claim 12, further comprising:
    receiving the one or more policies as configurable policies that include optimization for latency, bandwidth or quality of service.

15. The method of claim 12, further comprising:
    scoreboarding to track status of each of the plurality of operation phases.

16. The method of claim 12, wherein the forming the plurality of operation phases comprises:
    forming the command phase and the poll phase for each of the write operation, the read operation and the erase operation.

17. The method of claim 12, further comprising:
    receiving a first operation request from a first master performing read recovery and a second operation request from a second master, the first operation request includes varying a voltage threshold of a first one of the two or more flash memory devices through a first channel, responsive to arbitrating the first operation request.

18. The scheduling system of claim 1, wherein the plurality of masters, the scheduler and the sequencer cooperate to write data bits to faster access portions of flash memory and parity bits to slower access portions of the flash memory.

19. The scheduler of claim 7, wherein the plurality of masters, the arbiter, the scheduler and the sequencer cooperate to write data bits to faster access portions of flash memory and parity bits to slower access portions of the flash memory.

20. The method of claim 12, further comprising writing data bits to faster access portions of flash memory and parity bits to slower access portions of the flash memory, through the forming, the arbitrating, the communicating and the generating.

* * * * *